(12) United States Patent
Zhou et al.

(10) Patent No.: US 11,917,891 B2
(45) Date of Patent: Feb. 27, 2024

(54) DISPLAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Hongjun Zhou, Beijing (CN); Lili Du, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 427 days.

(21) Appl. No.: 17/417,776

(22) PCT Filed: Sep. 22, 2020

(86) PCT No.: PCT/CN2020/116905
§ 371 (c)(1),
(2) Date: Jun. 24, 2021

(87) PCT Pub. No.: WO2022/061543
PCT Pub. Date: Mar. 31, 2022

(65) Prior Publication Data
US 2022/0336547 A1 Oct. 20, 2022

(51) Int. Cl.
*H01L 35/24* (2006.01)
*H01L 51/00* (2006.01)
(Continued)

(52) U.S. Cl.
CPC .......... *H10K 59/88* (2023.02); *H10K 59/131* (2023.02); *G09G 3/006* (2013.01); *G09G 3/3233* (2013.01);
(Continued)

(58) Field of Classification Search
CPC ...... H10K 59/88; H10K 59/131; H10K 71/70; G09G 3/006; G09G 3/3233; G09G 2330/12; G09G 2300/0452
(Continued)

(56) References Cited

U.S. PATENT DOCUMENTS 10,679,561 B2 * 6/2020 Kim ................... G09G 3/3258
10,891,883 B2 * 1/2021 Jung .................. G09G 3/3225
(Continued)

FOREIGN PATENT DOCUMENTS

| CN | 103698911 A | 4/2014 |
| CN | 107039467 A | 8/2017 |

(Continued)

OTHER PUBLICATIONS

Hongguang XU, "Study on the crucial technologies of OLED-on-silicon microdisplay", Shanghai University Doctoral Dissertation, Sep. 2013.

*Primary Examiner* — Theresa T Doan
(74) *Attorney, Agent, or Firm* — Ling Wu; Stephen Yang; Ling and Yang Intellectual Property

(57) ABSTRACT

A display substrate and a display apparatus are provided, the display substrate includes a base substrate including a display region and a peripheral region; the display region includes multiple sub-pixels, multiple data lines and multiple power supply lines; the peripheral region includes at least one test data signal line, at least one test control signal line and multiple test units, the multiple test units are at a side of the multiple data lines away from the display region, and at least one of the multiple test units is electrically connected with at least one of the multiple data lines, the at least one test data signal line, and the at least one test control signal line; the peripheral region further includes a first power supply bus and multiple connecting parts, the first (Continued)

power supply bus is at a side of the multiple test units away from the display region.

18 Claims, 18 Drawing Sheets

(51) Int. Cl.
  *H10K 59/131*  (2023.01)
  *H10K 59/88*  (2023.01)
  *G09G 3/00*  (2006.01)
  *G09G 3/3233*  (2016.01)

(52) U.S. Cl.
  CPC .............. *G09G 2300/0819* (2013.01); *G09G 2300/0842* (2013.01); *G09G 2330/12* (2013.01)

(58) Field of Classification Search
  USPC ........................................................ 257/40
  See application file for complete search history.

(56) References Cited

U.S. PATENT DOCUMENTS

| | | |
|---|---|---|
| 2013/0176194 A1 | 7/2013 | Jin et al. |
| 2014/0167769 A1 | 6/2014 | Kim et al. |
| 2014/0253419 A1 | 9/2014 | Tanada |
| 2015/0090961 A1 | 4/2015 | Lee |
| 2018/0151100 A1 | 5/2018 | Zhou |
| 2018/0330653 A1 | 11/2018 | Zhou |
| 2021/0349500 A1 | 11/2021 | Qin et al. |

FOREIGN PATENT DOCUMENTS

| | | |
|---|---|---|
| CN | 107154232 A | 9/2017 |
| CN | 108389516 A | 8/2018 |
| CN | 109102771 A | 12/2018 |
| CN | 109637444 A | 4/2019 |
| CN | 110190103 A | 8/2019 |
| CN | 111028758 A | 4/2020 |
| CN | 111489648 A | 8/2020 |
| CN | 111681552 A | 9/2020 |
| KR | 10-2017-0126537 A | 11/2017 |

* cited by examiner

DISPLAY SUBSTRATE AND DISPLAY APPARATUS

CROSS-REFERENCE TO RELATED APPLICATION

The present application is a U.S. National Phase Entry of International Application No. PCT/CN2020/116905 having an international filing date of Sep. 22, 2020 and entitled "Display Substrate and Display Apparatus", the contents of which should be construed as being hereby incorporated by reference.

TECHNICAL FIELD

The present disclosure relates to, but is not limited to, the field of display technology, in particular to a display substrate and a display apparatus.

BACKGROUND

An Organic Light Emitting Diode (OLED) is an active light emitting display device, and has advantages of self-emission, wide view angle, high contrast, low power consumption, extremely high response speed, etc.

SUMMARY

The following is a summary of subject matter described in detail herein. This summary is not intended to limit the protection scope of the claims.

Exemplary embodiments of the present disclosure provide a display substrate, including:

a base substrate including a display region and a peripheral region located at least one side of the display region;

multiple sub-pixels located in the display region;

multiple data lines located in the display region and electrically connected with the multiple sub-pixels, wherein the multiple data lines are configured to provide data signals to the multiple sub-pixels;

multiple power supply lines located in the display region and electrically connected with the multiple sub-pixels, wherein the multiple power supply lines are configured to provide power supply signals to the multiple sub-pixels;

at least one test data signal line located in the peripheral region;

at least one test control signal line located in the peripheral region;

multiple test units located in the peripheral region and at a side of the multiple data lines away from the display region, at least one of the multiple test units is electrically connected with at least one of the multiple data lines, the at least one test data signal line, and the at least one test control signal line, and is configured to transmit a signal provided by the at least one test data signal line to the at least one data line according to a signal provided by the at least one test control signal line;

a first power supply bus located in the peripheral region and at a side of the multiple test units away from the display region; and multiple connecting parts electrically connected with the first power supply bus and electrically connected with the multiple power supply lines, wherein the multiple connecting parts extend to the display region along a region between the multiple test units.

In an exemplary embodiment, the display substrate further includes a second power supply bus between the multiple test units and the display region, wherein the multiple connecting parts are electrically connected with the first power supply bus and the second power supply bus respectively.

In an exemplary embodiment, the first power supply bus, the second power supply bus and the multiple connecting parts define multiple first openings arranged in an array, and an orthographic projection of the multiple test units on the base is substrate in the multiple first openings.

In an exemplary embodiment, the second power supply bus includes multiple second openings, and the multiple test units include multiple transistors, and drains of the multiple transistors are located in the multiple second openings.

In an exemplary embodiment, the test unit includes a first test transistor, a second test transistor and a third test transistor; the at least one test data signal line includes a first test data signal line, a second test data signal line and a third test data signal line; the at least one test control signal line includes a first test control signal line, a second test control signal line and a third test control signal line; the multiple data lines include first data lines and second data lines which are alternately arranged; a source of the first test transistor and a source of the second test transistor are connected with the first test data signal line and the second test data signal line respectively, a drain of the first test transistor and a drain of the second test transistor are connected with a first data line, and a gate of the first test transistor and a gate of the second test transistors are connected with the third test control signal line and the second test control signal line respectively; and a source of the third test transistor is connected with the third test data signal line, a drain of the third test transistor is connected with a second data line, and a gate of the third test transistor is connected with the first test control signal line.

In an exemplary embodiment, the test unit further includes a fourth test transistor and a fifth test transistor, a drain of the fourth test transistor and a drain of the fifth test transistor are connected with another first data line, a gate of the fourth test transistor and a gate of the fifth test transistor are connected with the second test control signal line and the third test control signal line respectively, and a source of the fourth test transistor and a source of the fifth test transistor are connected with the first test data signal line and the second test data signal line.

In an exemplary embodiment, the first test transistor, the second test transistor and the third test transistor are located in one of the multiple first openings, and the fourth test transistor and the fifth test transistor are located in a first opening adjacent to the one first opening.

In an exemplary embodiment, the first test transistor, the second test transistor, the fourth test transistor and the fifth test transistor are located in one of the multiple first openings, and the third test transistor is located in a first opening adjacent to the one first opening.

In an exemplary embodiment, the test unit further includes a fourth test transistor, a fifth test transistor and a sixth test transistor, a drain of the fourth test transistor and a drain of the fifth test transistor are connected with another first data line, a gate of the fourth test transistor and a gate of the fifth test transistor are connected with the second test control signal line and the third test control signal line respectively, and a source of the fourth test transistor and a source of the fifth test transistor are connected with the first test data signal line and the second test data signal line; and a source of the sixth test transistor is connected with the third test data signal line, a drain of the sixth test transistor is connected with another second data line, and a gate of the sixth test transistor is connected with the first test control signal line.

In an exemplary embodiment, the first test transistor, the second test transistor, and the third test transistor are located in one of the multiple first openings, and the fourth test transistor, the fifth test transistor, and the sixth test transistor are located in a first opening adjacent to the one first opening.

In an exemplary embodiment, the test unit includes a seventh test transistor, an eighth test transistor and a ninth test transistor; the at least one test data signal line includes a fourth test data signal line, a fifth test data signal line and a sixth test data signal line; the at least one test control signal line includes a fourth test control signal line;

the multiple data lines include a third data line, a fourth data line and a fifth data line which are alternately arranged; a drain of the seventh test transistor is connected with the third data line, a source of seventh test transistor is connected with the fourth test data signal line, and a gate of the seventh test transistor is connected with the fourth test control signal line; a drain of the eighth test transistor is connected with the fourth data line, a source of the eighth test transistor is connected with the fifth test data signal line, and a gate of the eighth test transistor is connected with the fourth test control signal line; and a drain of the ninth test transistor is connected with the fifth data line, and a source of the ninth test transistor is connected with the sixth test data signal line, and a gate of the ninth test transistor is connected with the fourth test control signal line.

In an exemplary embodiment, the seventh test transistor, the eighth test transistor and the ninth test transistor are located in one of the multiple first openings.

In an exemplary embodiment, the at least one test control signal line and the at least one test data signal line are arranged in parallel along an extending direction of the multiple connecting parts and are located between the multiple test units and the first power supply bus.

In an exemplary embodiment, at least one of the multiple connecting parts further includes a third opening, and an orthographic projection of the third opening on the base substrate overlaps with an orthographic projection of at least one of the at least one test data signal line and the at least one test control signal line on the base substrate.

In an exemplary embodiment, wherein in a plane perpendicular to the display substrate, the display substrate includes a buffer layer, a first active layer, a gate insulating layer, a first gate metal layer, a first insulating layer, a second gate metal layer, a second insulating layer and a first source-drain metal layer stacked on the base substrate; the at least one test control signal line, the at least one test data signal line, the first power supply bus and the multiple power supply lines are all located on the first source-drain metal layer; and the multiple connecting parts are located on the second gate metal layer, and are connected with the first power supply bus and the multiple power supply lines respectively through via holes on the second insulating layer; or, the multiple connecting parts are located on the first gate metal layer, and the multiple connecting parts are connected with the first power supply bus and the multiple power supply lines respectively through via holes penetrating through the first insulating layer and the second insulating layer.

In an exemplary embodiment, wherein in a plane perpendicular to the display substrate, the display substrate includes a buffer layer, a first active layer, a gate insulating layer, a first gate metal layer, a first insulating layer, a second gate metal layer, a second insulating layer and a first source-drain metal layer stacked on the base substrate; the at least one test control signal line, the at least one test data signal line, the first power supply bus and the multiple power supply lines are all located on the first source-drain metal layer; and the multiple connecting part includes first connecting parts and second connecting parts, wherein the second connecting parts are located on the second gate metal layer, and the second connecting parts are connected with the first power supply bus and the multiple power supply lines respectively through via holes on the second insulating layer; the first connecting parts are located on the first gate metal layer, and the first connecting parts are connected with the first power supply bus and the multiple power supply lines respectively through via holes penetrating through the first insulating layer and the second insulating layer.

In an exemplary embodiment, the display substrate further includes multiple data signal input lines located in the peripheral region, wherein the multiple data signal input lines are located at a side of the multiple test units away from the display region, and at least one of the multiple data signal input lines is electrically being connected with the at least one test unit.

An exemplary embodiment of the present disclosure further provides a display apparatus, including any aforementioned display substrate.

Other aspects will become apparent after the drawings and the detailed description are read and understood.

BRIEF DESCRIPTION OF DRAWINGS

Drawings are used to provide a further understanding of technical solutions of the present disclosure and form a part of the description to explain the technical solutions of the present disclosure together with embodiments of the present disclosure, which do not constitute any limitation on the technical solutions of the present disclosure. Shapes and sizes of the components in the drawings do not reflect true scales and only to be used to schematically illustrate contents of the present disclosure.

DETAILED DESCRIPTION

Figure 1:
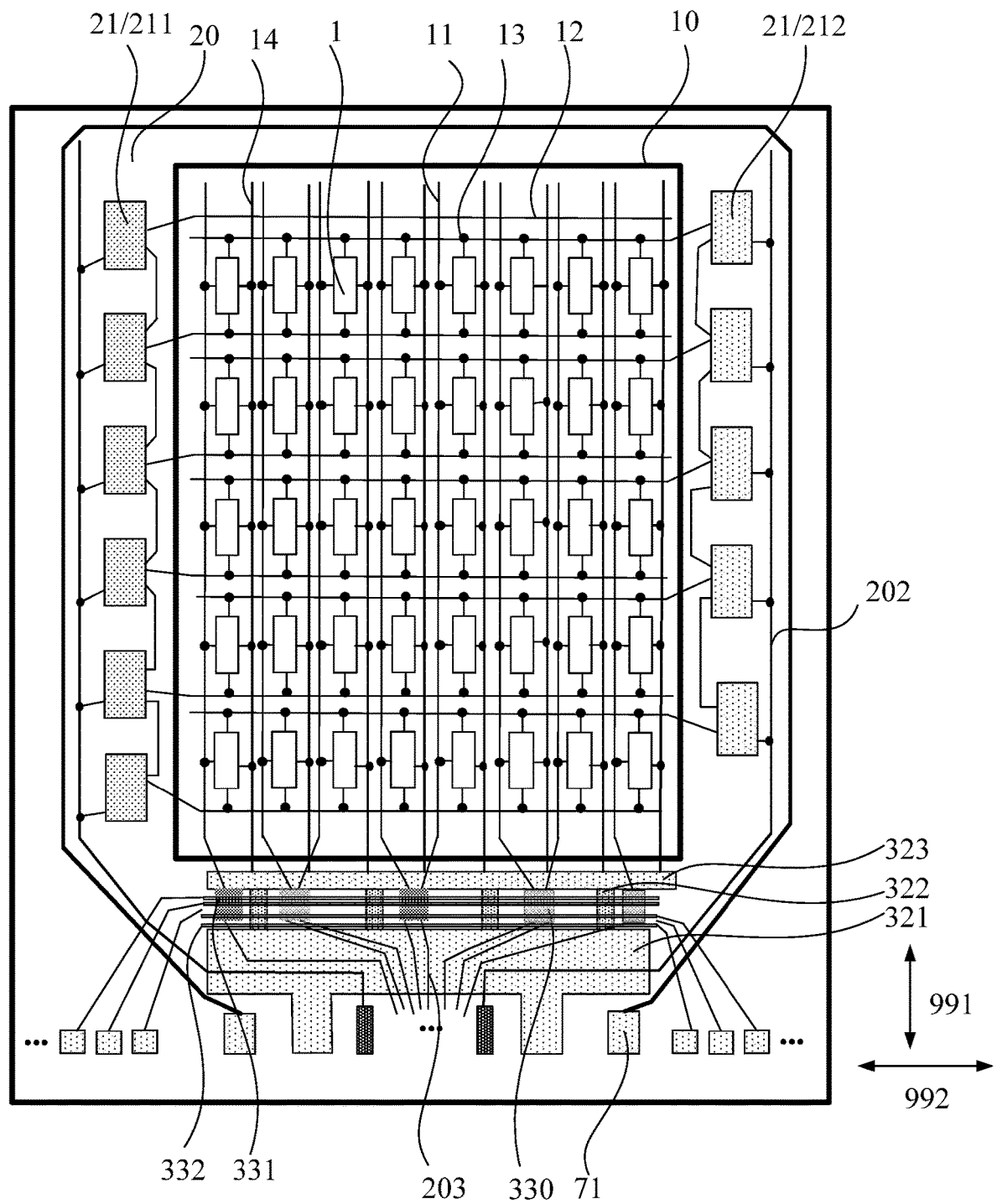
FIG. 1 is a schematic diagram of a structure of a display substrate according to an exemplary embodiment of the present disclosure.

In order to make the objects, technical solutions and advantages of the present disclosure more clear, embodiments of the present disclosure will be described in detail below with reference to the drawings. It should be noted that the embodiments may be implemented in a number of different forms. Those of ordinary skills in the art will readily understand the fact that implementations and contents may be transformed into a variety of forms without departing from the spirit and scope of the present disclosure. Therefore, the present disclosure should not be construed as being limited only to what is described in the following embodiments. The embodiments and features in the embodiments in the present disclosure may be combined randomly if there is no conflict.

In the drawings, sizes of constituent elements and thicknesses and areas of layers are sometimes exaggerated for clarity. Therefore, an implementation of the present disclosure is not necessarily limited to the sizes shown. The shapes and sizes of components in the drawings do not reflect true scales. In addition, the drawings schematically show ideal examples, and an implementation of the present disclosure is not limited to the shapes or values shown in the drawings.

The ordinal numbers "first", "second", "third" and the like in this specification are used to avoid confusion between constituent elements, but not to constitute limitations on quantities.

In this specification, for sake of convenience, wordings such as "central", "upper", "lower", "front", "rear", "vertical", "horizontal", "top", "bottom", "inner", "outer" and the like describe the orientation or positional relations between constituent elements with reference to the drawings, which are only for ease of description of this specification and for simplification of the description, rather than indicating or implying that the apparatus or element referred to must have a specific orientation, or must be constructed and operated in a particular orientation, and therefore cannot be construed as limitations on the present disclosure. The positional relations between the constituent elements are appropriately changed according to the direction in which each constituent element is described. Therefore, they are not limited to the wordings in the specification, and may be replaced appropriately according to the situations.

In this specification, terms "install", "connect" and "couple" shall be understood in a broad sense unless otherwise explicitly specified and defined. For example, a connection may be a fixed connection, or may be a detachable connection, or an integrated connection; it may be a mechanical connection, or may be an electrical connection; it may be a direct connection, or may be an indirect connection through middleware, or may be an internal connection between two elements. For those of ordinary skills in the art, the specific meanings of the above terms in the present disclosure may be understood according to specific situations.

In this specification, a transistor refers to an element including at least three terminals, namely a gate electrode, a drain electrode and a source electrode. The transistor has a channel region between the drain electrode (also referred to as a drain electrode terminal, a drain region or a drain electrode) and the source electrode (also referred to as a source electrode terminal, a source region or a source electrode), and current can flow through the drain electrode, the channel region and the source electrode. It should be noted that in this specification, the channel region refers to a region through which current mainly flows.

In this specification, a first electrode may be a drain electrode and a second electrode may be a source electrode, or the first electrode may be a source electrode and the second electrode may be a drain electrode. The functions of the "source electrode" and that of the "drain electrode" are interchangeable under circumstances where transistors with opposite polarities are used or where the current direction changes during circuit operation. Therefore, in this specification, "source electrode" and "drain electrode" are interchangeable.

In this specification, an "electrical connection" includes a case where constituent elements are connected together through an element having certain electrical action. The "element having the certain electrical action" is not particularly limited as long as it can transmit and receive electrical signals between connected constituent elements. Examples of the "elements having certain electrical function" include not only electrodes and traces, but also switching elements such as transistors, resistors, inductors, capacitors, and other elements having various functions.

In this specification, "parallel" refers to a state in which two straight lines form an angle above −10 degrees and below 10 degrees, and thus also includes a state in which the angle is above −5 degrees and below 5 degrees. In addition, "vertical" refers to a state in which two straight lines form an angle between 80 degrees and 100 degrees and thus, includes a state in which the angle is between 85 and 95 degrees.

In the present disclosure, "about" means that there is no strict limit for a value, and values within an error range during processes and measurement are allowed.

Figure 2:
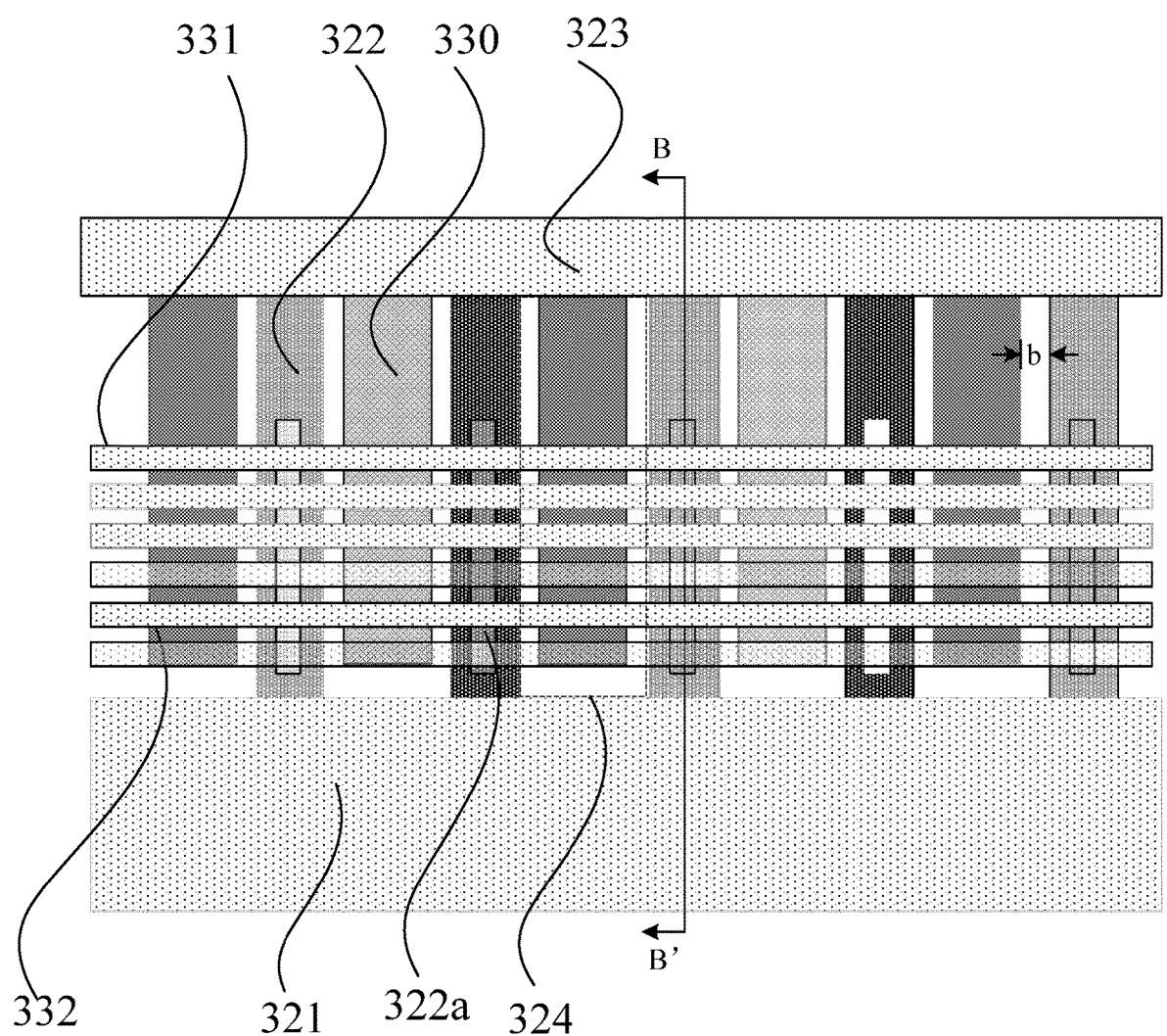
FIG. 2 is an enlarged schematic diagram of a structure of a test unit and a connecting part of a display substrate according to an exemplary embodiment of the present disclosure.

As shown in FIG. 1 and FIG. 2, an exemplary embodiment of the present disclosure provides a display substrate including:

a base substrate (not shown in the figures) including a display region 10 and a peripheral region 20 located at least one side of the display region 10;

multiple sub-pixels 1 located in the display region 10;

multiple data lines 11 located in the display region 10 and electrically connected with the multiple sub-pixels 1, the multiple data lines 11 are configured to provide data signals to the multiple sub-pixels 1;

multiple power supply lines 14 located in the display region 10 and electrically connected with the multiple sub-pixels 1, the multiple power supply lines 14 are configured to provide power supply signals to the multiple sub-pixels 1;

multiple test units 330 located in the peripheral region 20 and at a side of the multiple data lines 11 away from the display region 10, at least one of the test units 330 is electrically connected with at least one of the multiple data lines 11, at least one test data signal line 332 and at least one test control signal line 331 respectively, and is configured to transmit a signal provided by at least one test data signal line 332 to at least one of the multiple data lines 11 according to a signal provided by at least one test control signal line 331;

a first power supply bus 321 located in the peripheral region 20 and at a side of the multiple test units 330 away from the display region 10; and multiple connecting parts 322 electrically connected with the first power supply bus 321 and electrically connected with the multiple power supply lines 14, and extending to the display region 10 along a region between the multiple test units 330.

In an exemplary embodiment, referring to FIG. 1, the display substrate further includes multiple data signal input lines 203 located in the peripheral region 20, the multiple data signal input lines 203 are located at a side of the multiple test units 330 away from the display region 10, and the multiple data signal input lines 203 are electrically connected with the multiple data lines 11 respectively. At least one of the multiple data signal input lines 203 is electrically connected with at least one test unit 330.

In an exemplary embodiment, referring to FIG. 1 and FIG. 2, the display substrate further includes a second power supply bus 323 located between the multiple test units 330 and the display region 10, wherein the multiple connecting parts 322 are electrically connected with the first power supply bus 321 and the second power supply bus 323 respectively.

In an exemplary embodiment, referring to FIG. 2, the first power supply bus 321, the second power supply bus 323 and the multiple connecting parts 322 define multiple first openings 324 arranged in an array, and an orthographic projection of the multiple test units 330 on the base substrate is located in the multiple first openings 324.

Referring to FIG. 1, the base substrate of the display substrate according to the embodiment of the present disclosure may be a flexible base substrate or a rigid base substrate, and the middle part of the base the display region 10 is the display region 10 for displaying, sub-pixels 1 for displaying are disposed in the display region 10, and the periphery of the display region 10 is the peripheral region 20 provided with other structures.

Among them, "a certain structure is located in a certain region" means that the orthographic projection of the structure on the base substrate is located within the area.

The multiple sub-pixels 1 for displaying are disposed in the display region 10 of the base substrate, and each sub-pixel 1 is a smallest point that can independently emit light with required brightness and color. The specific forms of the sub-pixels 1 are various as long as it can realize independent display. Generally, multiple sub-pixels 1 may form one "pixel" which can display light of any color and brightness, and each "pixel" is one "point" in an image to be displayed.

Leads used for providing driving signals to the sub-pixels 1 are also disposed in the display region 10, for example the data lines 11 for providing data signals (data voltages) to the sub-pixels 1. The data lines 11 extend along a first direction 991.

Referring to FIG. 1, in some embodiments, other leads, such as gate lines 12 and control lines 13, are also disposed in the display region 10. The gate lines 12 and the control lines 13 extend along a second direction 992. The first direction 991 intersects with the second direction 992 (i.e., the first direction 991 and the second direction 992 are not parallel to each other), so that each intersection of the data lines 11 and the gate line 12 may define one sub-pixel 1, and the sub-pixels 1 at the intersections of the data lines 11 and the gate lines 12 may display under joint control of the gate lines 12 and the data lines 11.

In some embodiments, the first direction 991 is perpendicular to the second direction 992, that is, the first direction 991 may be a column direction (a longitudinal direction in FIG. 1) and the second direction 992 may be a row direction perpendicular to the column direction (a transverse direction in FIG. 1).

It should be understood that each unit (including the test units 330, driving units 21, etc.) and the sub-pixel 1 in FIG. 1 are represented by "rectangle", which are only schematic, but in fact, each unit (including the test units 330, the driving units 21, etc.) and the sub-pixel 1 is composed of multiple devices, and a region occupied by the unit is not necessarily rectangular. It should be understood that, due to the limitation on areas, shapes, sizes, size ratios, numbers, number ratios, positions, etc. of various structures such as leads (for example signal lines), joints, cells and regions of sub-pixels 1 in many drawings of the embodiments of the present disclosure are only exemplary, and are not limitations on the embodiments of the present disclosure. For example, the actual numbers of gate lines 12, data lines 11, control lines 13, etc. should be more than those shown in FIG. 1.

Referring to FIG. 1, in some embodiments, the sub-pixels 1 in the display region 10 are arranged in a matrix, that is, in multiple rows and columns. The data lines 11 are all parallel to the column direction, and each data line 11 is electrically connected with one column of sub-pixels 1. The gate lines 12 are all parallel to the row direction, and each gate line 12 is electrically connected with one row of sub-pixels 1. The control lines 13 are all parallel to the row direction, and each control line 13 is electrically connected with one row of sub-pixels 1.

Therefore, when each bezel of image is displayed, turn-on signals (signals enabling transistors to be turned on) may be supplied to each gate line 12 in turn (time-division). When turn-on signals are supplied to each gate line 12, each data line 11 writes a data signal into each sub-pixel 1 (such as a row of sub-pixels 1) electrically connected with the gate line 12, and the data signal is stored in a storage capacitor Cst for the sub-pixel 1 to display for the remaining time of the bezel according to the stored data signal. And the control line 13 is used to control whether the sub-pixels 1 are allowed to emit light or not.

Multiple test units 330 and multiple pads 71 are further disposed in the peripheral region 20 of the base substrate, the multiple test units 330 are located between the multiple data lines 11 and multiple data signal input lines 203, or the multiple test units 330 are located between the first power supply bus 321 and the second power supply bus 323, and the multiple pads 71 are located at a side of the test units 330 away from the display region 10.

The pads 71 are structures disposed on the base substrate for acquiring signals, and may be one or more sheet-like metal layers disposed on the base substrate. For example, the pads 71 may be structures (for example pins) for bonding connection with a flexible printed circuit board (FPC) or a driving chip (IC), so that signals from the flexible printed circuit board or the driving chip may be acquired. At least part of the pads 71 are used to provide data signals to the data lines 11, that is, at least part of the pads 71 are used to provide data signals to the data lines 11 during displaying to control the sub-pixels 1 connected with the data lines 11 to display required contents, and at least part of the pads 71 are used to provide positive power supply signals to the power supply lines (for example, the power supply lines include positive power supply lines and negative power supply lines, wherein the positive power supply lines may be composed of the first power supply bus 321, the multiple connecting parts 322, the second power supply bus 323 and multiple power supply lines 14 within the display region 10), and at least part of the pads 71 are used to provide clock signals.

The test units 330 are electrically connected with test data signal lines 332 and test control signal lines 331, so that each test unit 330 is used to provide (simultaneously or separately) a signal (data signal) of the test data signal lines 332 to multiple data lines 11 electrically connected with the test unit under control of the test control signal lines 331, so as to determine whether the sub-pixels 1 electrically connected with these data lines 11 can be lighted up and whether there are bad spots or bright spots.

In rigid OLED products, a test circuit for unit test is usually placed in an upper bezel of the display panel. At this time, it is necessary to transmit test signals from the signal input ends at the lower bezel of the display panel to the upper bezel of the display panel along the left and right sides of the display panel. In this process, a longer test signal trace generates larger circuit impedance, which reduces the signal driving capability of the test signal trace, and even affects the unit test effect of products in severe cases. In addition, the test signal trace on the left and right sides of the display panel also limit the further reduction of the left and right bezels of the display panel, which is not beneficial to a narrow bezel design of the display panel.

According to the display substrate of the embodiment of the present disclosure, the test units 330 are disposed on the side of the data lines 11 away from the display region 10, which may avoid a problem of larger circuit impedance caused by placing the test units 330 on the top of the display region 10, so as to enhance the signal driving capability, improve the test effect of unit test, save the signal trace space of the left and right bezels, and facilitate the narrow bezel design. In addition, in the display substrate according to the embodiment of the present disclosure, multiple connecting parts 322 are disposed between the first power supply bus 321 and multiple power supply lines, so that current at a single trace is significantly reduced, thereby reducing the influence of resistance increase caused by cross-layer jumpers on voltage drops, thus facilitating display uniformity and reducing product power consumption.

In some embodiments, referring to FIG. 1, the peripheral region 20 is divided into a first half region and a second half region along the second direction 992 which are opposite to each other at two sides of the display region 10. Driving unit 21 located in the first half region are gate driving units 211, wherein the gate driving units 211 are configured to provide gate driving signals to the multiple gate lines 12.

Referring to FIG. 1, the peripheral region 20 may be divided into two "half regions (a left half region and a right half region in FIG. 1)" along the second direction 992 which are opposite to each other at two sides of the display region 10. In some embodiments, driving units 21 in the first half region may be gate driving units 211 which provide gate driving signals to the multiple gate lines 12, so that the gate driving units 211 are connected with nearby corresponding gate lines 12. Driving units 21 located in the second half region are control driving units 212, wherein the control driving units 212 are configured to provide control driving signals to the multiple control lines 13, so that the control driving units 212 are connected with corresponding control lines 13 nearby.

In an exemplary embodiment, each gate driving unit 211 may be a gate shift register (GOA), and multiple gate shift registers are cascaded, so that the multiple gate shift registers may provide driving signals to the multiple gate lines 12 respectively.

In an exemplary embodiment, each control driving unit 212 may be a control shift register (EM GOA), and multiple control shift registers are cascaded, so that the multiple control shift registers may provide driving signals to the multiple control lines 13 respectively.

In some embodiments, the driving units 21 in the two half regions may also be all gate driving units 211, which provide gate driving signals to different gate lines 12 respectively, or provide gate driving signals to each gate line 12 from two sides at the same time (that is, double-sided driving).

In an exemplary embodiment, referring to FIG. 2, at least one test control signal line 331 and at least one test data signal line 332 are arranged in parallel along an extending direction of the connecting parts 322, and are located between the multiple test units 330 and the first power supply bus 321.

In an exemplary embodiment, referring to FIG. 2, at least one connecting part 322 of the multiple connecting parts 322 includes a third opening 322a, and an orthographic projection of the third opening 322a on the base substrate overlaps with an orthographic projection of at least one test signal line on the base substrate, and the test signal lines includes a test control signal line 331 and a test data signal line 332.

Since there is an overlapping region between the test signal lines and the connecting part 322, many parasitic capacitances will be formed in the overlapping region, which will easily cause signal input differences at different traces of the connecting part 322 (for bidirectional driving, the circuit impedance (RC Loading) at two end regions of the display region 10 is usually small, and the circuit impedance in the middle region of the display region is large), which will cause poor display (usually the closer to the middle position it is, the larger brightness it has). In the display substrate of the embodiment of the present disclosure, one or more third openings 322a are disposed in a part of the a connecting part 322 overlapping with the test signal lines, so that this part of the connecting part 322 is divided into multiple thin lines, and the influence of parasitic capacitance at this part is reduced.

In an exemplary embodiment, as shown in FIG. 2, an interval b between the test unit 330 and the connecting part 322 is larger than a minimum exposure accuracy between the patterns in a same layer. For example, if the minimum exposure accuracy between the patterns in the same layer is 3 microns, the interval b between the test unit 330 and the connecting part 322 is greater than 3 microns. For example, the interval b between the test unit 330 and the connecting part 322 may be 5 microns.

In some embodiments, a pixel circuit is disposed in each sub-pixel 1 to allow the sub-pixel 1 to emit light.

Figure 3:
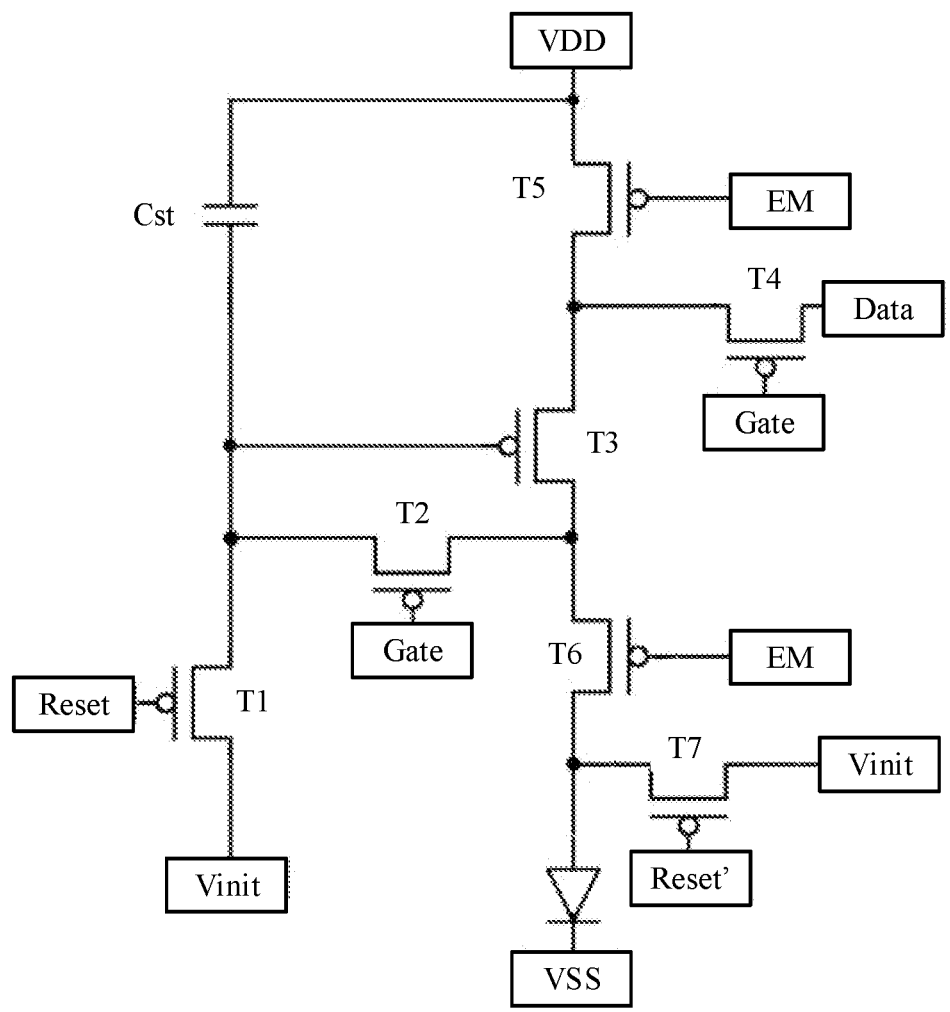
FIG. 3 is a schematic circuit diagram of a pixel circuit in a display substrate according to an embodiment of the present disclosure.

For example, referring to FIG. 3, the pixel circuit has a 7T1C structure, which includes a first transistor T1, a second transistor T2, a driving transistor T3 (a third transistor), a fourth transistor T4, a fifth transistor T5, a sixth transistor T6, a seventh transistor T7, a storage capacitor Cst, an organic light emitting diode OLED, a first reset terminal Reset, a second reset terminal Reset', an initialization terminal Vinit, and a gate line terminal Gate, a data line terminal Data, a control line terminal EM, a positive terminal VDD, a negative terminal VSS, etc. Each transistor may be a P-type transistor (for example PMOS) or an N-type transistor (for example NMOS). The data line terminal Data may be connected with a data line 11, the gate line terminal Gate may be connected with a gate line 12, the control line terminal EM may be connected with a control line 13. The first reset terminal Reset and the second reset terminal Reset' may be connected with a gate line of a previous row at the same time, the second reset terminal Reset' may also be connected with a gate line of the current row, and other terminals may also be connected with corresponding signal sources.

In the above pixel circuit, an appropriate data signal is written to a gate of the driving transistor T3, that is a current flowing through the driving transistor T3 can be controlled, thereby controlling the organic light emitting diode OLED to emit light with corresponding brightness so as to realize the display of the sub-pixel 1.

Figure 4:
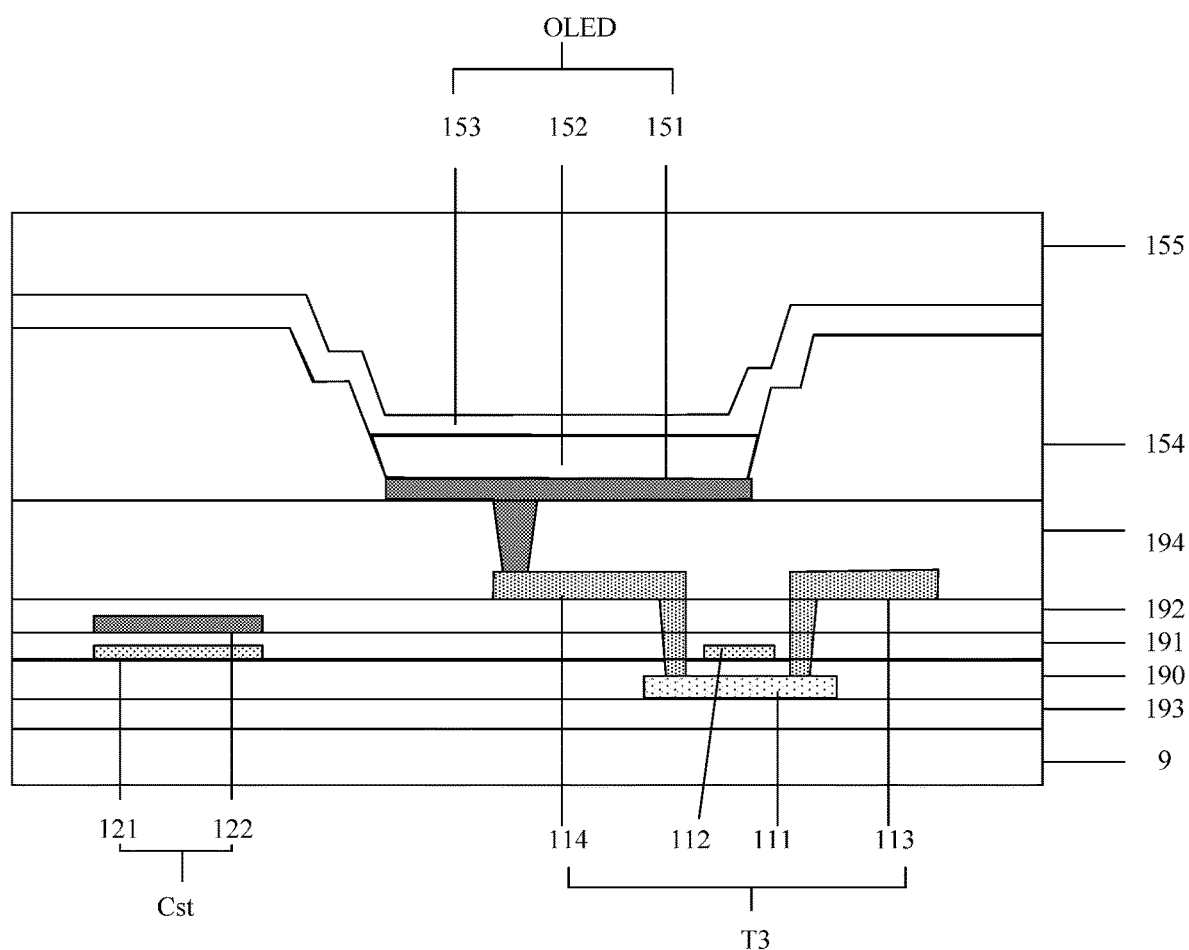
FIG. 4 is a schematic diagram of a structure of a display region of a display substrate according to an embodiment of the present disclosure.

Among them, the positive terminal VDD is electrically connected with a positive signal source (for example, via hole a positive line), the negative terminal VSS is electrically connected with a negative signal source (for example, a cathode layer 153 of the organic light emitting diode OLED (as shown in FIG. 4) is directly connected with the negative signal source), the control line terminal EM is connected with the control line 13, the gate line terminal Gate is connected with the gate line 12, and the data line terminal Data is connected with the data line 11. Other terminals are also electrically connected with the corresponding signal sources.

Of course, the specific structure of the sub-pixel 1 and the pixel circuit is not limited to the above manner.

Referring to FIG. 4, in some embodiments, each sub-pixel 1 includes a driving transistor T3 and a storage capacitor Cst.

The driving transistor T3 includes:
a first active layer 111 located on a side of the base substrate;
a gate insulating layer 190 located on a side of the first active layer 111 away from the base substrate;
a first gate 112 located on a side of the gate insulating layer 190 away from the base substrate;
a first insulating layer 191 located on a side of the first gate 112 away from the base substrate;
a second insulating layer 192 (interlayer insulating layer ILD) located on a side of the first insulating layer 191 away from the base substrate; and
a first source 113 and a first drain 114 located on a side of the second insulating layer 192 away from the base substrate and electrically connected with the first active layer 11.

The storage capacitor Cst includes:
a first plate 121 disposed in a same layer as the first gate 112; and
a second plate 122 located between the first insulating layer 191 and the second insulating layer 192.

When the pixel circuit of each sub-pixel 1 includes a driving transistor T3 and a storage capacitor Cst, a stacking relation between some structures in the sub-pixel 1 may be shown as FIG. 4.

Of course, the above sub-pixel 1 may also include other structures.

For example, referring to FIG. 4, a buffer layer (Buffrt) 193 may be disposed between the first gate 112 and the base substrate for improving the contact performance between the first gate 112 and the base substrate. A planarization layer (PLN) 194 may also be disposed on a side of the first source 113 and the first drain 114 away from the base substrate, and the above organic light emitting diode OLED may also be disposed on a side of the planarization layer 194 away from the base substrate. The organic light emitting diode OLED may include an anode layer 151 connected with a first drain 114, a light-emitting layer 152 and a cathode layer 153 disposed on a side of the anode layer 151 away from the base substrate, and a cathode layer 153, so that the anode layer 151, the light emitting layer 152 and the cathode layer 153 stacked with each other constitute the organic light emitting diode OLED. The organic light emitting diode OLED can be defined by a pixel definition layer(PDL) 154, and an encapsulation layer 155 and other structures may be further disposed on a side of the cathode layer 153 away from the base substrate.

Of course, the structure of the above sub-pixel 1 may also be changed.

For example, the encapsulation layer 155 may be further divided into an organic encapsulation layer, an inorganic encapsulation layer, etc., and may even include a laminated structure of the organic encapsulation layer and the inorganic encapsulation layer. In addition, the sub-pixel 1 may also be provided with other structures such as a reflective layer, a color filter film, etc.

It should be understood that layer structures of other transistors in the sub-pixel 1 may be disposed in same layers as corresponding structures of the driving transistor T3.

In the following description, the layers where some other structures are located are exemplarily introduced based on this stacking mode.

In an exemplary embodiment, as shown in FIG. 2, FIG. 5, FIG. 12, FIG. 13 and FIG. 15, the test signal lines include test control signal lines 331 and test data signal lines 332, and at least one test unit 330 includes multiple test transistors, each of the test transistors has a gate connected with one test control signal lines 331, a drain connected with one data line 11 and a source connected with one test data signal line 332. Each test signal line is connected with multiple test units 330.

Since each test data signal line 332 and each test control signal line 331 are all connected with multiple test units 330, these few test signal lines will not occupy a large layout area. A turn-on signal is supplied to the test control signal lines 331, that is, a signal in the test data signal lines 332 may be supplied to multiple corresponding data lines 11 through transistors in different test units 330, so that the detection of the display substrate is realized.

In an exemplary embodiment, referring to FIG. 5, FIG. 12, FIG. 13 and FIG. 15, the second power supply bus 323 includes multiple second openings 323a, wherein drains of multiple test transistors in the test unit 330 are located in the multiple second openings 323a.

Figure 5:
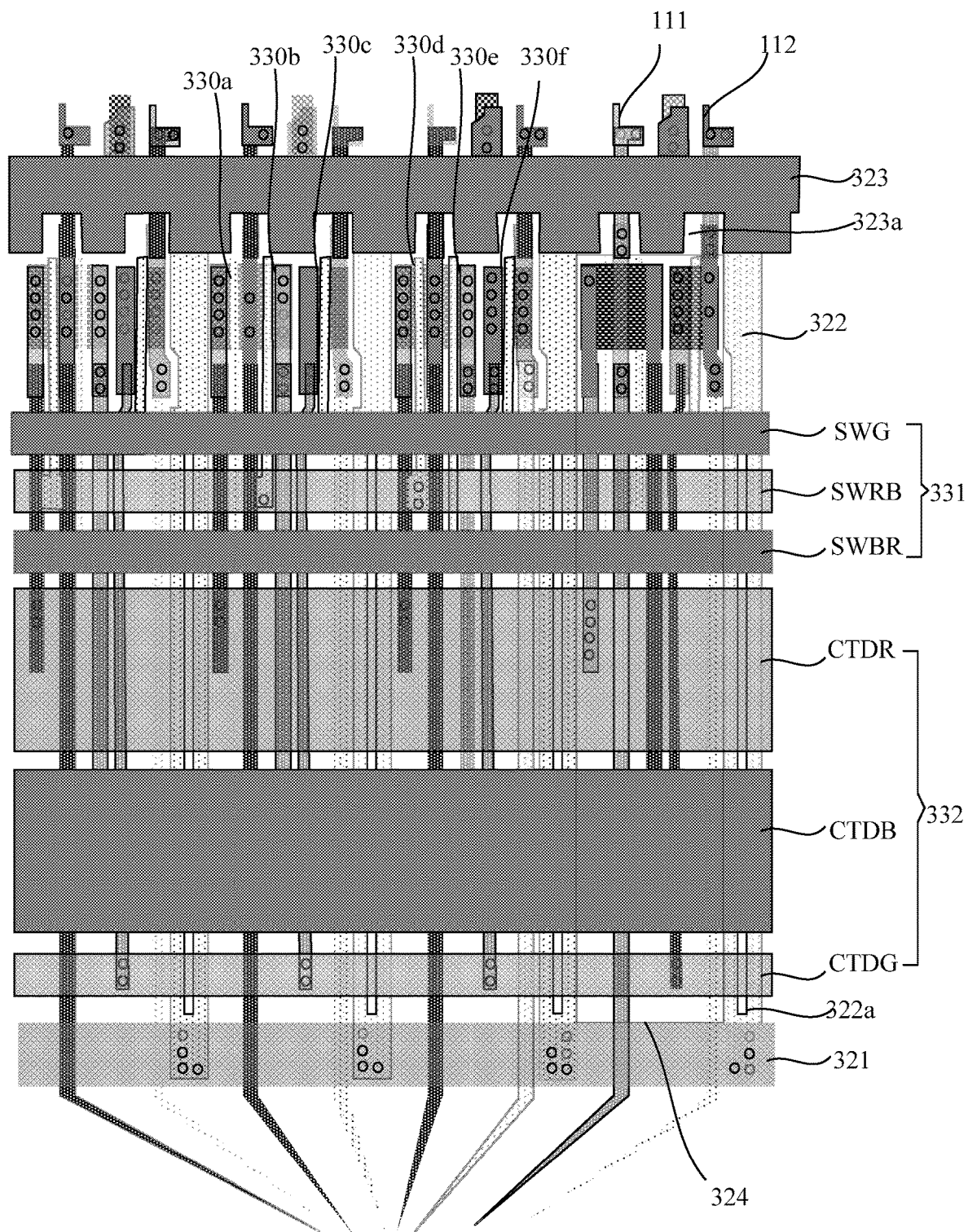
FIG. 5 is a first schematic diagram of a structure of a test unit region in a display substrate according to an exemplary embodiment of the present disclosure.
Figure 6:
FIG. 6 is a schematic diagram of a structure of a layer where an active layer of the test unit region shown in FIG. 5 is located.
Figure 7:
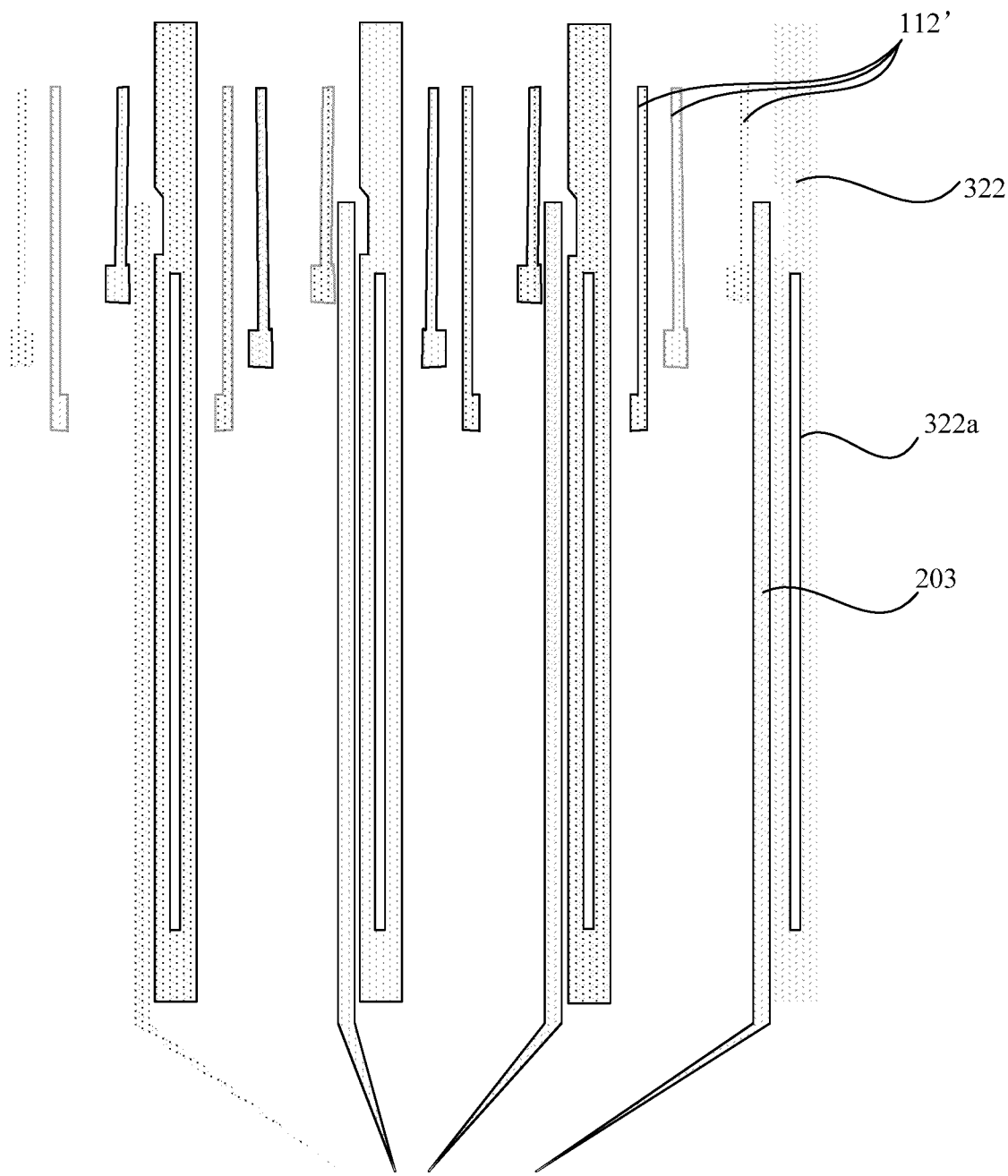
FIG. 7 is a schematic diagram of a structure of a layer where a first gate metal layer of the test unit region shown in FIG. 5 is located.
Figure 8:
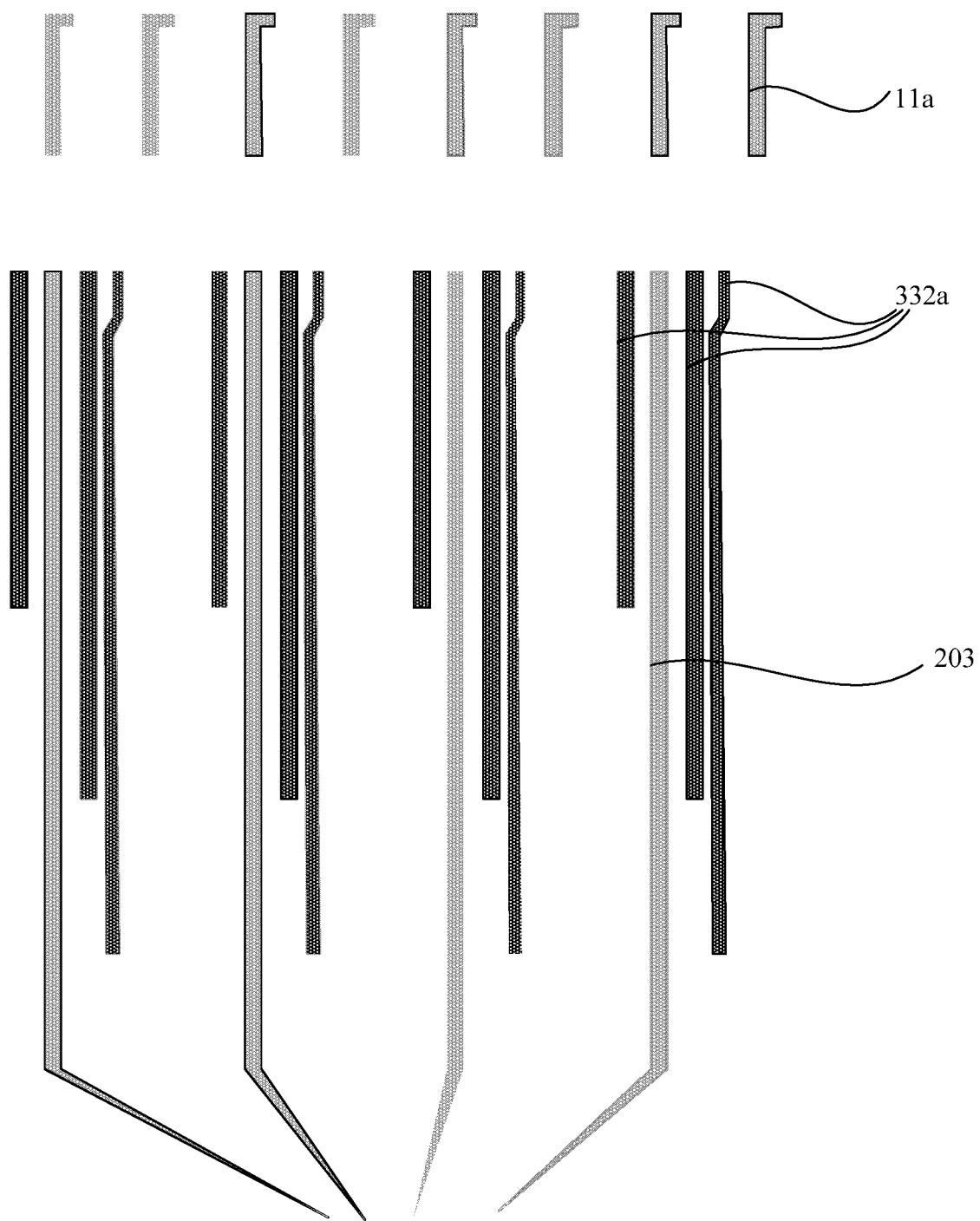
FIG. 8 is a schematic diagram of a structure of a layer where a second gate metal layer of the test unit region shown in FIG. 5 is located.
Figure 12:
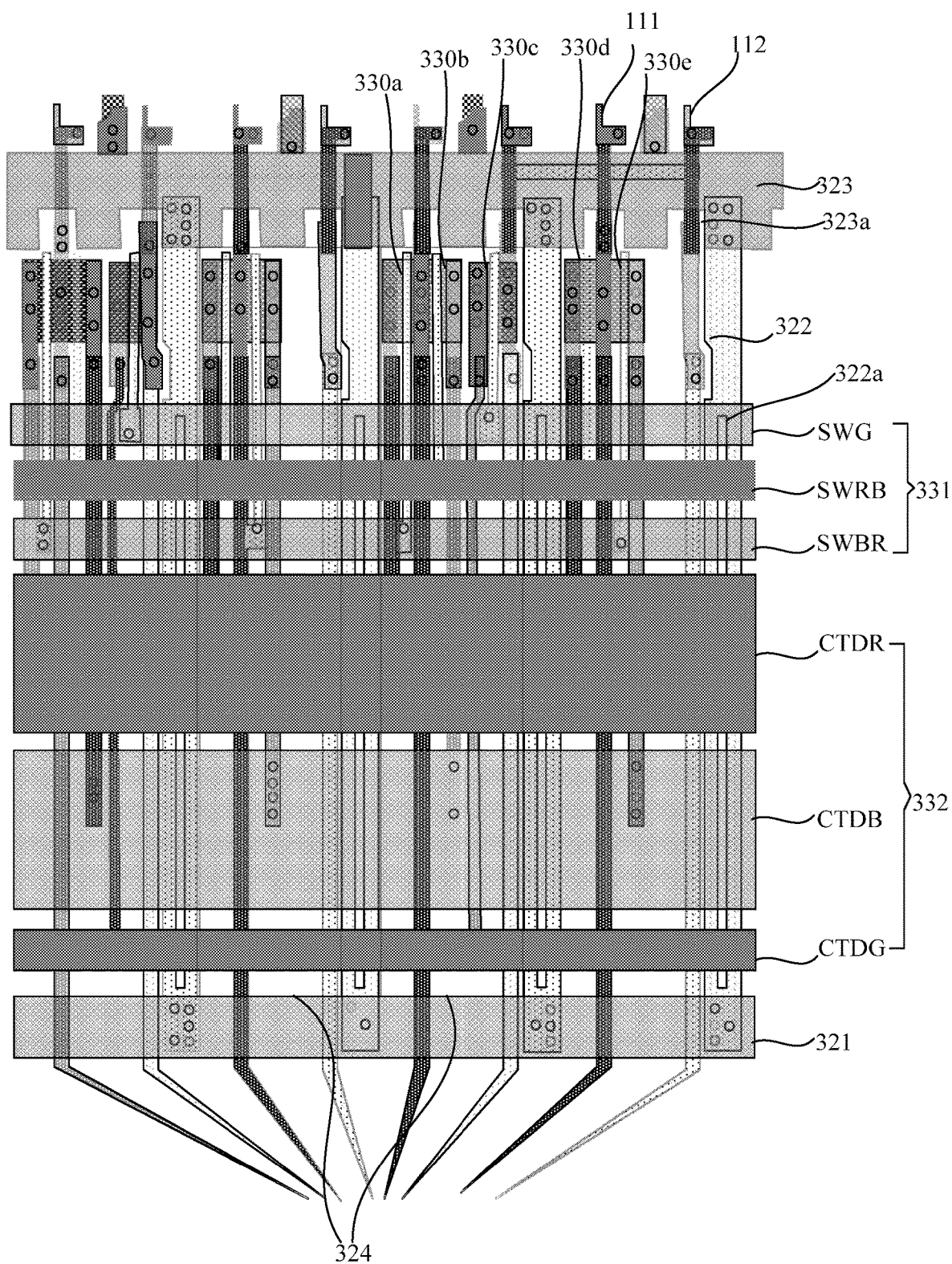
FIG. 12 is a second schematic diagram of a structure of a test unit region in a display substrate according to an exemplary embodiment of the present disclosure.
Figure 13:
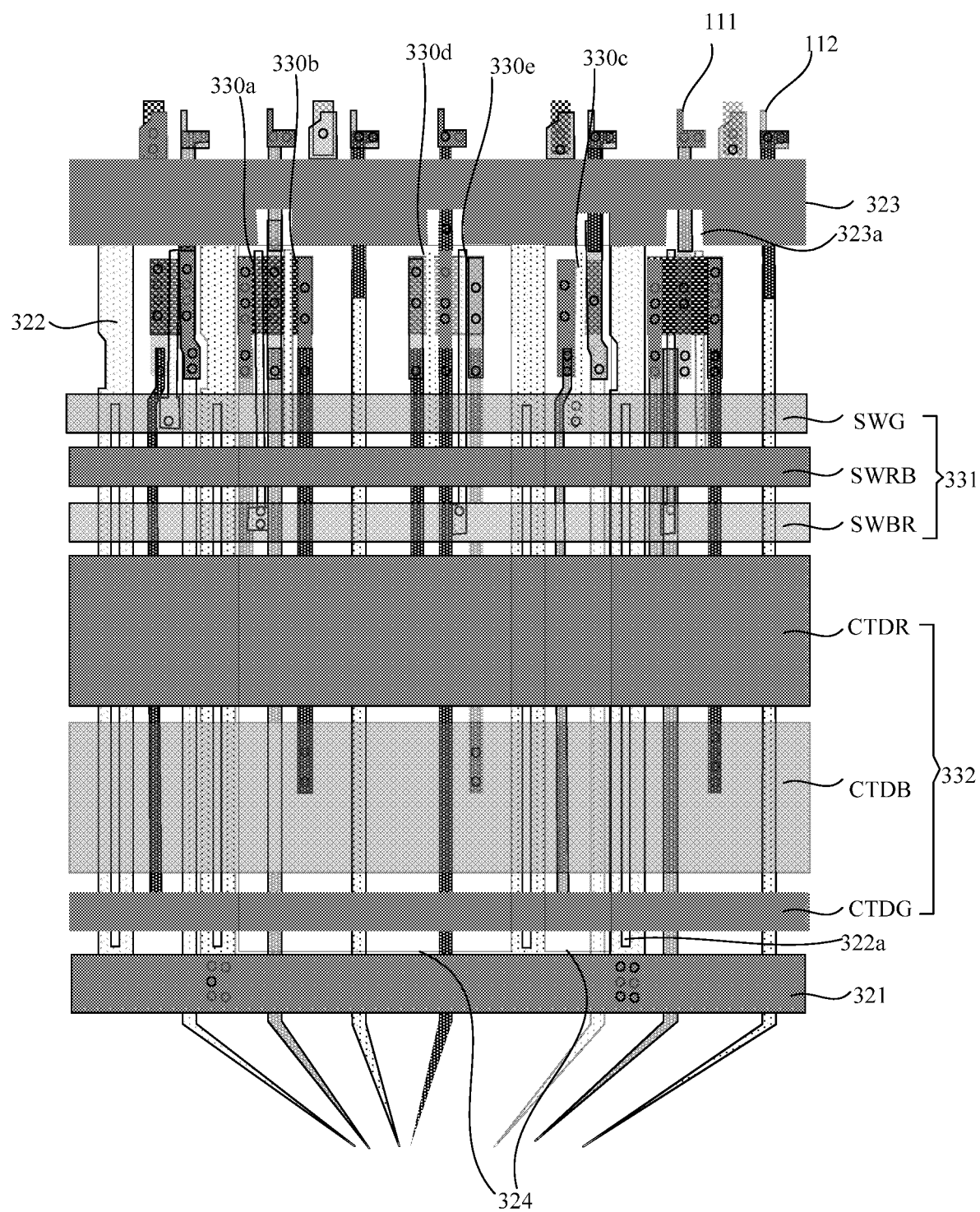
FIG. 13 is a third schematic diagram of a structure of a test unit region in a display substrate according to an exemplary embodiment of the present disclosure.

In an exemplary embodiment, as shown in FIG. 5, FIG. 12 or FIG. 13, the test unit 330 includes a first test transistor 330a, a second test transistor 330b and a third test transistor 330c. At least one test data signal line 332 includes a first test data signal line CTDR, a second test data signal line CTDB and a third test data signal line CTDG. At least one test control signal line 331 includes a first test control signal line SWG, a second test control signal line SWRB and a third test control signal line SWBR. The multiple data lines 11 include a first data line 111 and a second data line 112 arranged alternately.

A source of the first test transistor 330a and a source of the second test transistor 330b are connected with the first test data signal line CTDR and the second test data signal line CTDB respectively. A drain of the first test transistor 330a and a drain of the second test transistor 330b are connected with the first data line 111. A gate of the first test transistor 330a and a gate of the second test transistor 330b are connected with the third test control signal lines SWBR and the second test control signal lines SWRB respectively.

A source of the third test transistor 330c is connected with the third test data signal line CTDG, a drain of the third test transistor 330c is connected with the second data line 112, and a gate of the third test transistor 330c is connected with the first test control signal line SWG.

In an exemplary embodiment, as shown in FIG. 5, the test unit 330 further includes a fourth test transistor 330d, a fifth test transistor 330e and a sixth test transistor 330f, a drain of the fourth test transistor 330d and a drain of a fifth test transistor 330e are connected with another first data line 111. A gate of the fourth test transistor 330d and a gate of the fifth test transistor 330e are connected with the second test control signal line SWRB and the third test control signal line SWBR respectively. A source of the fourth test transistor 330d and a source of the fifth test transistor 330e are connected with the first test data signal line CTDR and the second test data signal line CTDB.

A source of the sixth test transistor 330f is connected with the third test data signal line CTDG, a drain of the sixth test transistor 330f is connected with another second data line 112, and a gate of the sixth test transistor 330f is connected with the first test control signal line SWG.

In an exemplary embodiment, the first test transistor 330a, the second test transistor 330b, and the third test transistor 330c are located in one of the multiple first openings, and the fourth test transistor 330d, the fifth test transistor 330e, and the sixth test transistor 330f are located in a first opening adjacent to the one first opening mentioned above.

Among them, a distribution mode of layers where the structures of the test unit 330 are specifically located may be varied.

Figure 9:
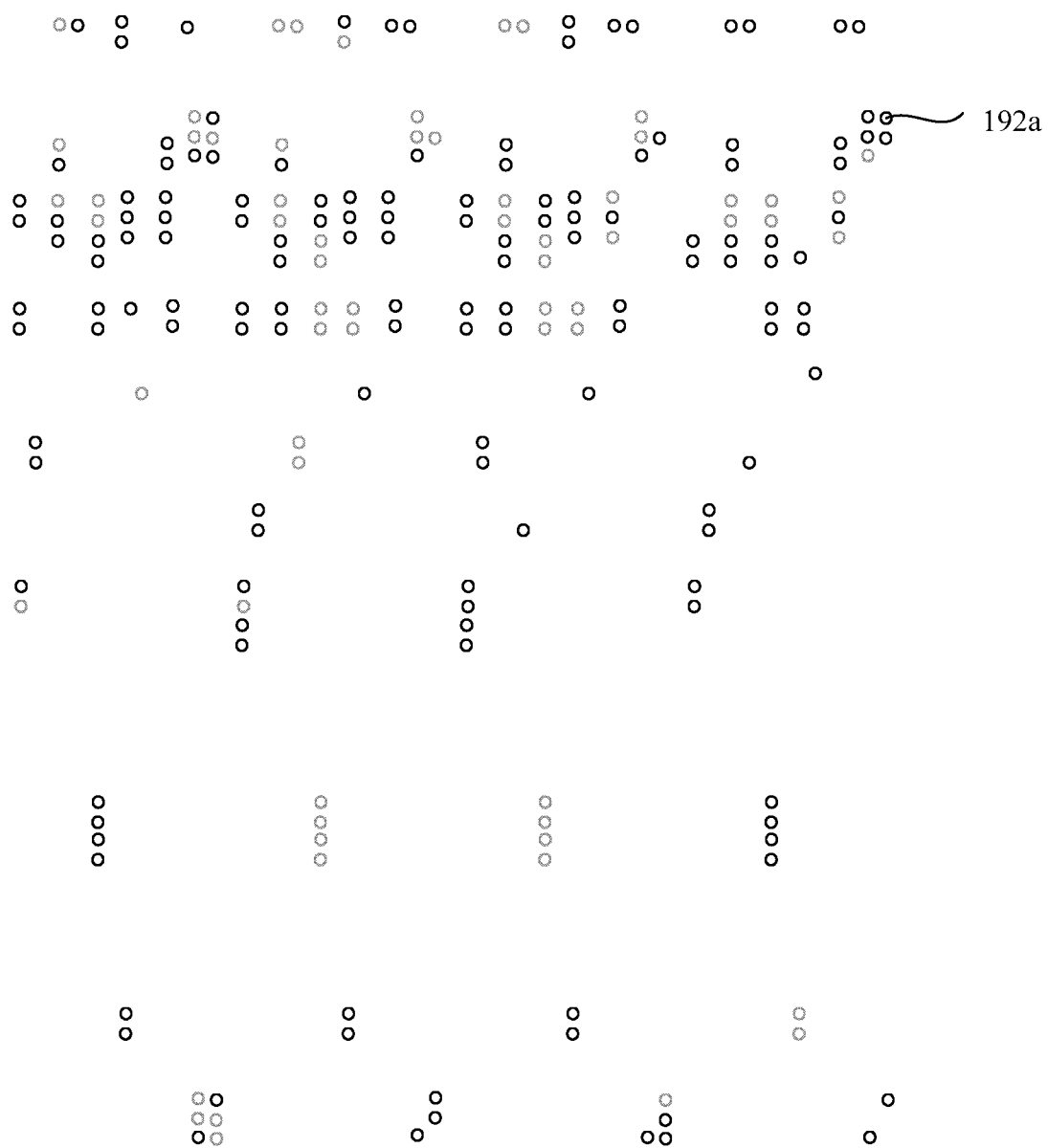
FIG. 9 is a schematic diagram of a via hole in an insulating layer of the test unit region shown in FIG. 5.
Figure 10:
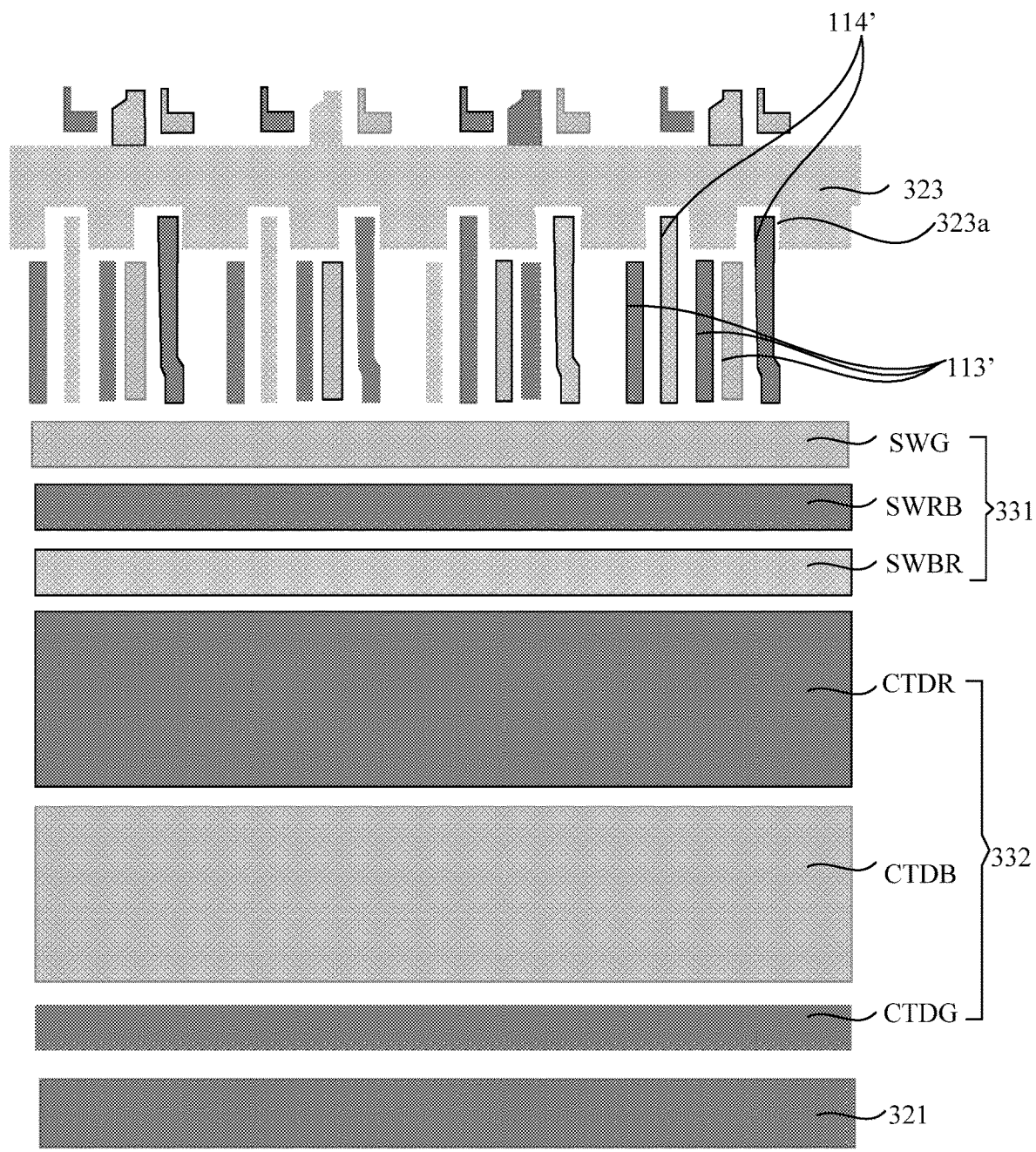
FIG. 10 is a schematic diagram of a structure of a layer where a source-drain metal layer of the test unit region shown in FIG. 5 is located.

For example, referring to FIG. 4, FIG. 5 to FIG. 10, active layers 111' (FIG. 6) of the test transistors are arranged at intervals along a second direction 992 (which may be disposed in a same layer as the first active layer 111) and covered by the gate insulating layer 190. A gate 112' of each test transistor may be disposed in a same layer as the first gate 112, and at the same time, multiple connecting parts 322 and a part of the data signal input lines 203 (FIG. 7) are disposed in this layer. A structure 11a (or regarded as a part of the data lines 11) for electrically connecting a drain of the test transistor with a corresponding data line 11 and a part of the data signal input lines 203, and a structure 332a (FIG. 8) for electrically connecting a source of the test transistor with a corresponding test data signal line 332 may be disposed in the same layer as the second plate 122. A source 113' and a drain 114' of the test transistor (FIG. 10) of the test transistor, the test control signal line 331, the test data signal line 332, the first power supply bus 321 and the second power supply bus 323 are disposed in a same layer as the first source 113 and the first drain 114. The electrical connection of a corresponding structure can be realized through via holes 192a in a second insulating layer 192 (FIG. 9).

A specific form of the above test unit 330 and a distribution mode of the layers where the structures are specifically located are only exemplary, and do not limit the embodiments of the present disclosure, so it will not be described in detail here.

Figure 11:
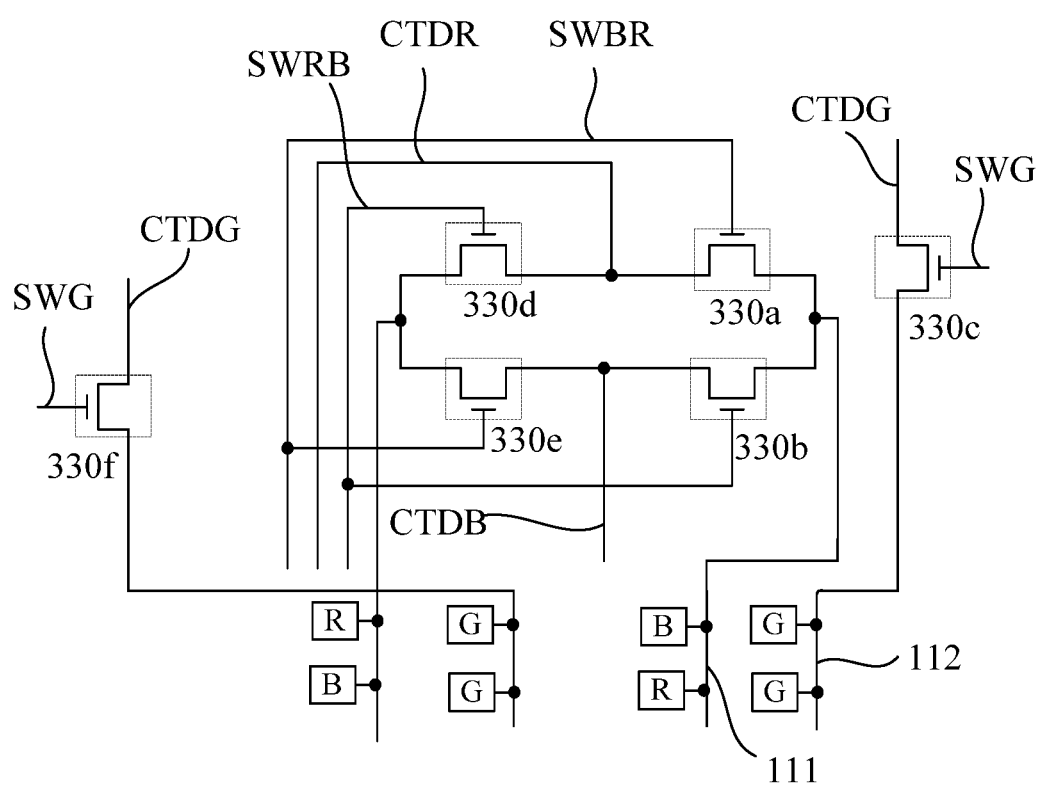
FIG. 11 is a first schematic diagram of a circuit structure of a test unit in a display substrate according to an exemplary embodiment of the present disclosure.

Referring to FIG. 11, a display substrate of this embodiment has three test data signal lines 332 and three test control signal lines 331, and each test unit 330 includes six test transistors for controlling four data lines 11 (which corresponds to the above four columns of sub-pixels 1, in every four columns of sub-pixels 1, two columns of sub-pixels 1 are green, and red sub-pixels 1 and blue sub-pixels 1 are alternately arranged in each of the remaining two columns of sub-pixels 1, and two sub-pixels 1 in any same row are blue and red respectively in this two columns of sub-pixels 1). Each test unit 330 includes a first test transistor 330a, a second test transistor 330b, a third test transistor 330c, a fourth test transistor 330d, a fifth test transistor 330e and a sixth test transistor 330f. A drain of the first test transistor 330a and a drain of the second test transistor 330b are connected with one column of red and blue mixed sub-pixels 1. A drain of the fourth test transistor 330d and a drain of the fifth test transistor 330e are connected with the other one column of red and blue mixed sub-pixels 1. A drain of the third test transistor 330c is connected with one column of green sub-pixels 1. A drain of the sixth test transistor 330f is connected with the other one column of green sub-pixels 1. A source of the first test transistor 330a and a source of the fourth test transistor 330d are connected with a first test data signal line CTDR. A source of the second test transistor 330b and a source of the fifth test transistor 330e are connected with a second test data signal line CTDB. A source of the third test transistor 330c and a source of the sixth test transistor 330f are connected with a third test data signal line CTDG. A gate of the first test transistor 330a and a gate of the fifth test transistor 330e are connected with a third test control signal line SWBR. A gate of the second test transistor 330b and a gate of the fourth test transistor 330d are connected with a second test control signal line SWRB. A gate of the third test transistor 330c and a gate of the sixth test transistor 330f are connected with a first test control signal line SWG.

It can be seen from the above arrangement that turn-on signals are supplied to the second test control signal line SWRB and the third test control signal line SWBR in turn, that is, the first test data signal line CTDR and the second test data signal line CTDB can respectively control the blue and red sub-pixels 1, while the first test control signal line SWG and the third test data signal line CTDG can control all the green sub-pixels 1, so that sub-pixels 1 of the same color can display the same brightness.

In an exemplary embodiment, as shown in FIG. 12 or FIG. 13, the test unit 330 may further include a fourth test transistor 330d and a fifth test transistor 330e. A drain of the fourth test transistor 330*d* and a drain of the fifth test transistor 330*e* are connected with another first data line 111. A gate of the fourth test transistor 330*d* and a gate of the fifth test transistor 330*e* are connected with the second test control signal line SWRB and the third test control signal line SWBR respectively. A source of the fourth test transistor 330*d* and a source of the fifth test transistor 330*e* are connected with the first test data signal line CTDR and the second test data signal line CTDB.

In an exemplary embodiment, as shown in FIG. 12, a first test transistor 330*a*, a second test transistor 330*b* and a third test transistor 330*c* are located in one of multiple first openings, and a fourth test transistor 330*d* and a fifth test transistor 330*e* are located in a first opening adjacent to the one first opening mentioned above.

In an exemplary embodiment, as shown in FIG. 13, a first test transistor 330*a*, a second test transistor 330*b*, a fourth test transistor 330*d* and a fifth test transistor 330*e* are located in one of the multiple first openings, and a third test transistor 330*c* is located in a first opening adjacent to the one first opening mentioned above.

Figure 14:
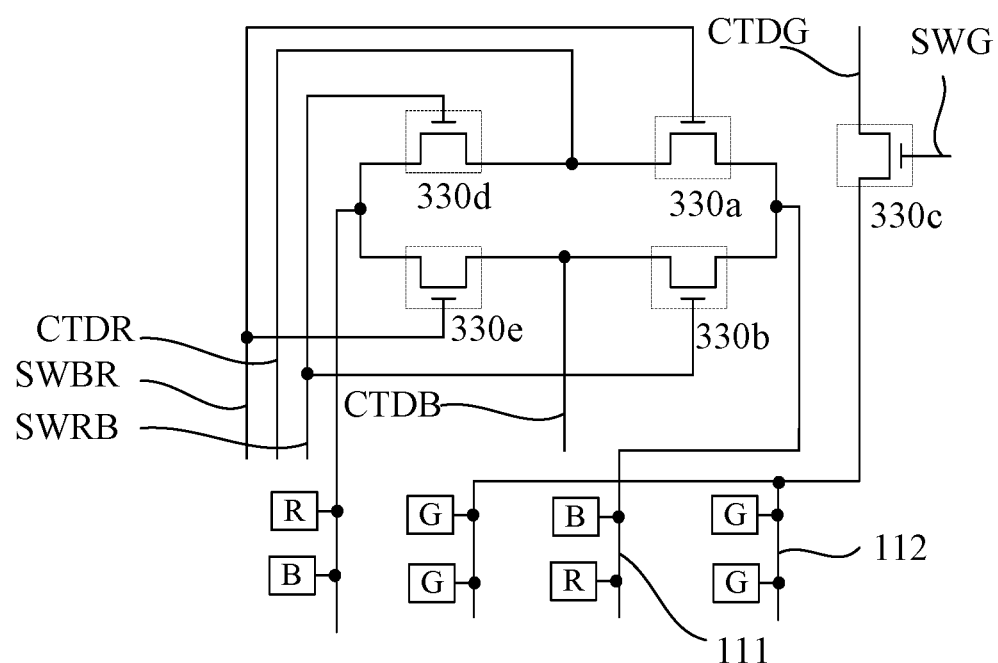
FIG. 14 is a second schematic diagram of a circuit structure of a test unit in the display substrate according to an exemplary embodiment of the present disclosure.

Referring to FIG. 14, a display substrate of this embodiment has three test data signal lines 332 and three test control signal lines 331, and each test unit 330 includes five test transistors for controlling four data lines 11 (which corresponds to the above four columns of sub-pixels 1, in every four columns of sub-pixels 1, two columns of sub-pixels 1 are green, and red sub-pixels 1 and blue sub-pixels 1 are alternately arranged in each of the rest two columns of sub-pixels 1, and two sub-pixels 1 in any same row are blue and red respectively in this two columns of sub-pixels 1). Each test unit 330 includes a first test transistor 330*a*, a second test transistor 330*b*, a third test transistor 330*c*, a fourth test transistor 330*d*, a fifth test transistor 330*e*. A drain of the first test transistor 330*a* and a drain of the second test transistor 330*b* are connected with one column of red and blue mixed sub-pixels 1. A drain of the fourth test transistor 330*d* and a drain of the fifth test transistor 330*e* are connected with the other one column of red and blue mixed sub-pixels 1. A drain of the third test transistor 330*c* is connected with two columns of green sub-pixels 1. A source of the first test transistor 330*a* and a source of the fourth test transistor 330*d* are connected with a first test data signal line CTDR. A source of the second test transistor 330*b* and a source of the fifth test transistor 330*e* are connected with a second test data signal line CTDB. A source of the third test transistor 330*c* and a source of the sixth test transistor 330*f* are connected with a third test data signal line CTDG. A gate of the first test transistor 330*a* and a gate of the fifth test transistor 330*e* are connected with a third test control signal line SWBR. A gate of the second test transistor 330*b* and a gate of the fourth test transistor 330*d* are connected with a second test control signal line SWRB. A gate of the third test transistor 330*c* is connected with a first test control signal line SWG.

It can be seen from the above arrangement that turn-on signals are supplied to the second test control signal line SWRB and the third test control signal line SWBR in turn, that is, the first test data signal line CTDR and the second test data signal line CTDB can respectively control the blue and red sub-pixels 1, while the first test control signal line SWG and the third test data signal line CTDG can control all the green sub-pixels 1, so that sub-pixels 1 of the same color can display the same brightness.

In an exemplary embodiment, N test units 330 may be disposed between two adjacent connecting parts 322, where N is a natural number greater than or equal to 1.

For example, one test unit 330 or two test units 330 may be disposed between two adjacent connecting parts 322.

In an exemplary embodiment, referring to FIG. 15 to FIG. 21, only one test control signal line 331 may be included. The number of test data signal lines 332 may be equal to the number of test transistors in each test unit 330 (for example, they are both three). Each test data signal line 332 is connected with a source of one test transistor in each test unit 330, while drains of different test transistors are connected with different data lines 11. The gates of all test transistors of all test units 330 are all connected with the test control signal line 331.

Figure 15:
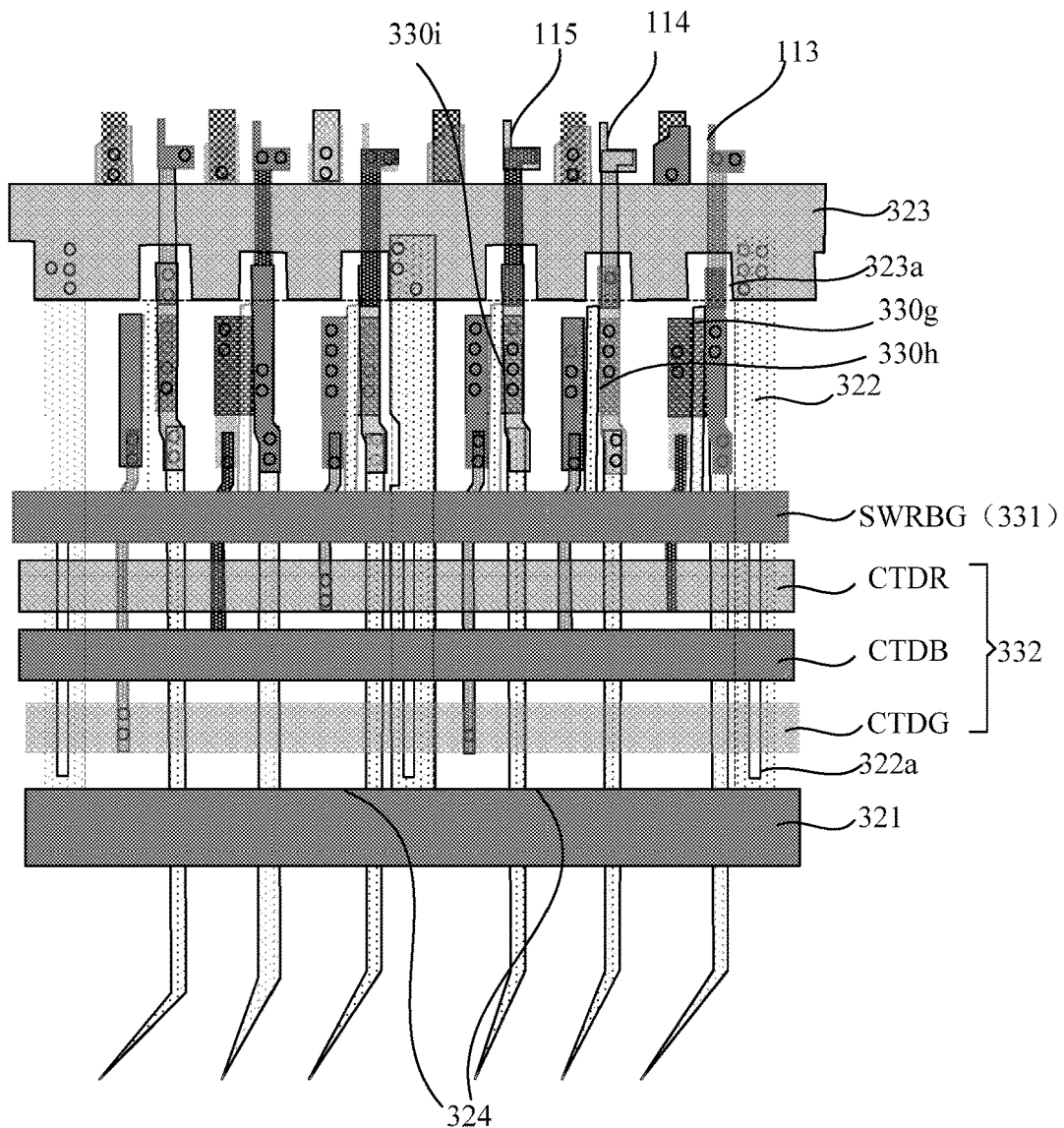
FIG. 15 is a fourth schematic diagram of a structure of a test unit region in a display substrate according to an exemplary embodiment of the present disclosure.
Figure 16:
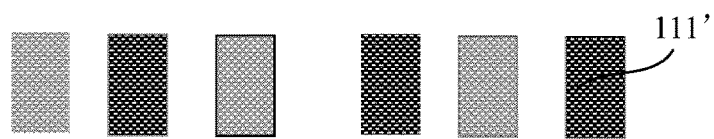
FIG. 16 is a schematic diagram of a structure of a layer where an active layer of the test unit region shown in FIG. 15 is located.
Figure 17:
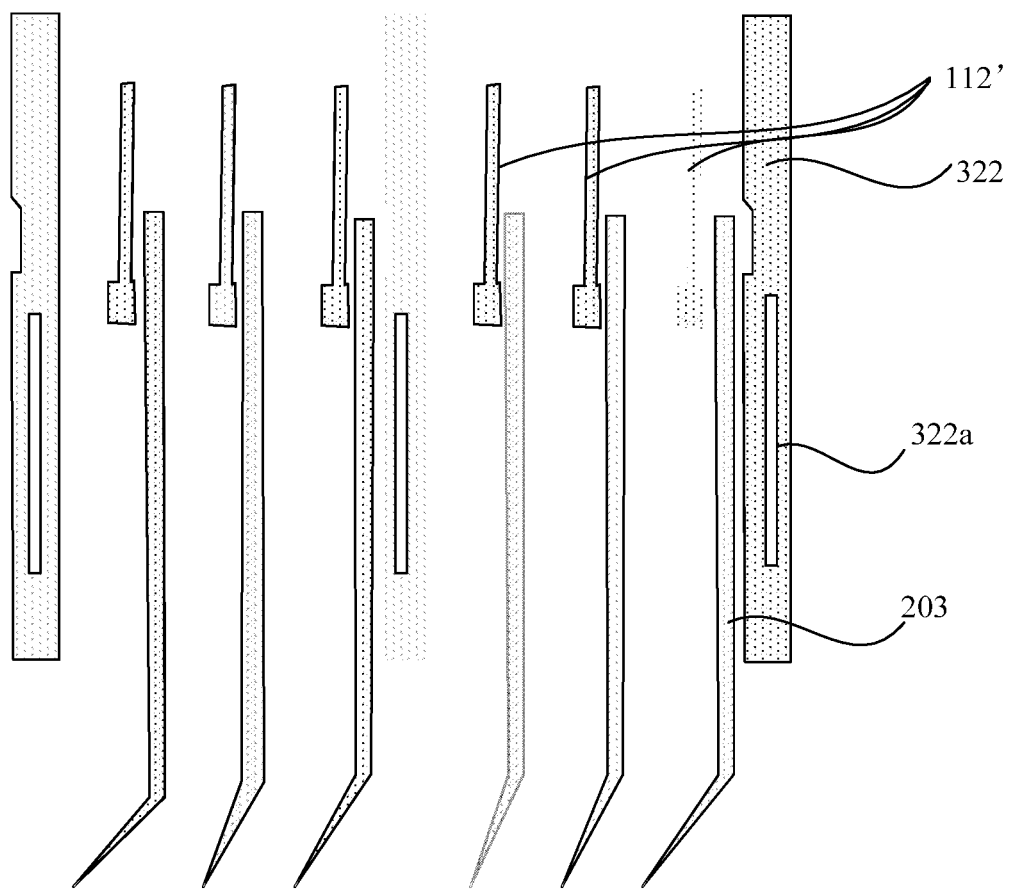
FIG. 17 is a schematic diagram of a structure of a layer where a first gate metal layer of the test unit region shown in FIG. 15 is located.
Figure 18:
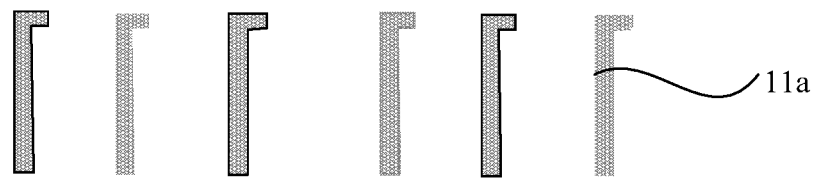
FIG. 18 is a schematic diagram of a structure of a layer where a second gate metal layer of the test unit region shown in FIG. 15 is located.
Figure 18:
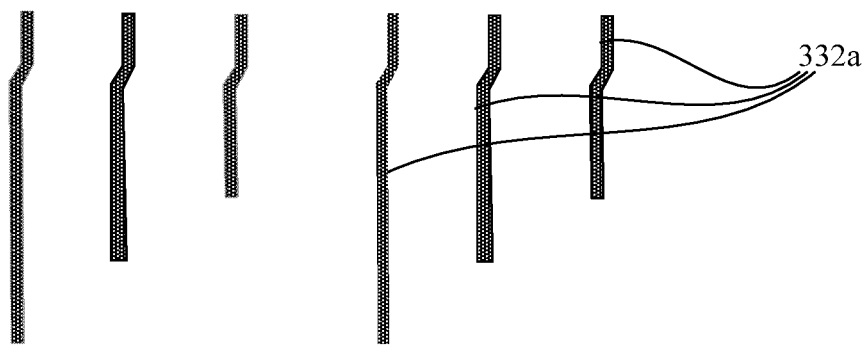

As shown in FIG. 15, the test unit includes a seventh test transistor 330*g*, an eighth test transistor 330*h* and a ninth test transistor 330*i*. At least one test data signal line 332 includes a fourth test data signal line CTDR, a fifth test data signal line CTDB and a sixth test data signal line CTDG. At least one test control signal line 331 includes a fourth test control signal line SWRGB. The multiple data lines 11 include a third data line 113, a fourth data line 114 and a fifth data line 115 which are alternately arranged.

A drain of the seventh test transistor 330*g* is connected with the third data line 113, a source of the seventh test transistor 330*g* is connected with the fourth test data signal line CTDR, and a gate of the seventh test transistor 330*g* is connected with the fourth test control signal line SWRGB. A drain of the eighth test transistor 330*h* is connected with the fourth data line 114, a source of the eighth test transistor 330*h* is connected with the fifth test data signal line CTDB, and a gate of the eighth test transistor 330*h* is connected with the fourth test control signal line SWRGB. A drain of the ninth test transistor 330*i* is connected with the fifth data line 115, a source of the ninth test transistor 330*i* is connected with the sixth test data signal line CTDG, and a gate of the ninth test transistor 330*i* is connected with the fourth test control signal line SWRGB.

In an exemplary embodiment, the seventh test transistor 330*g*, the eighth test transistor 330*h*, and the ninth test transistor 330*i* are located in one of multiple first openings.

Figure 21:
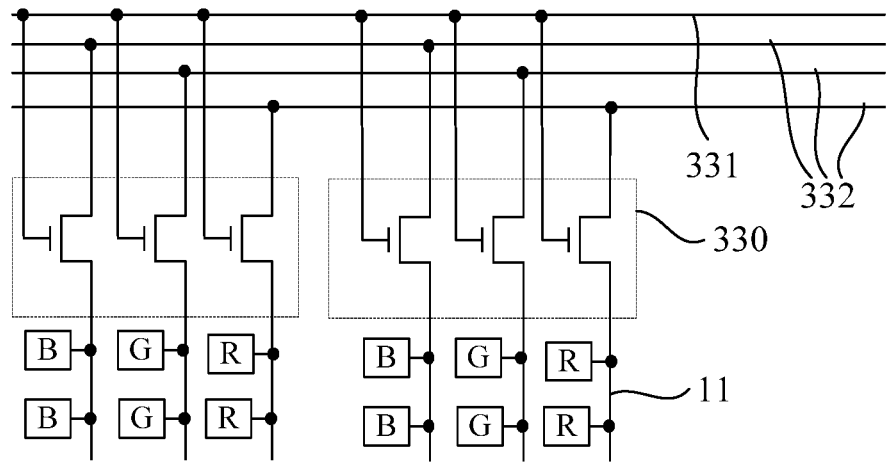
FIG. 21 is a third schematic diagram of a circuit structure of a test unit in a display substrate according to an exemplary embodiment of the present disclosure.

In this case, referring to FIG. 21, the color of sub-pixels 1 connected with each data line 11 may be the same (red sub-pixel represented by R, green sub-pixel represented by G, and blue sub-pixel represented by B in the figures), and the color of sub-pixels 1 connected with a data line 11 corresponding to each test data signal line 332 is the same. Therefore, the same test signal is continuously supplied to the test data signal line 332, so that the sub-pixels 1 of the same color can display the same brightness (for example displaying a white picture or other monochrome pictures as a whole), which is convenient for locating defective sub-pixels.

Figure 19:
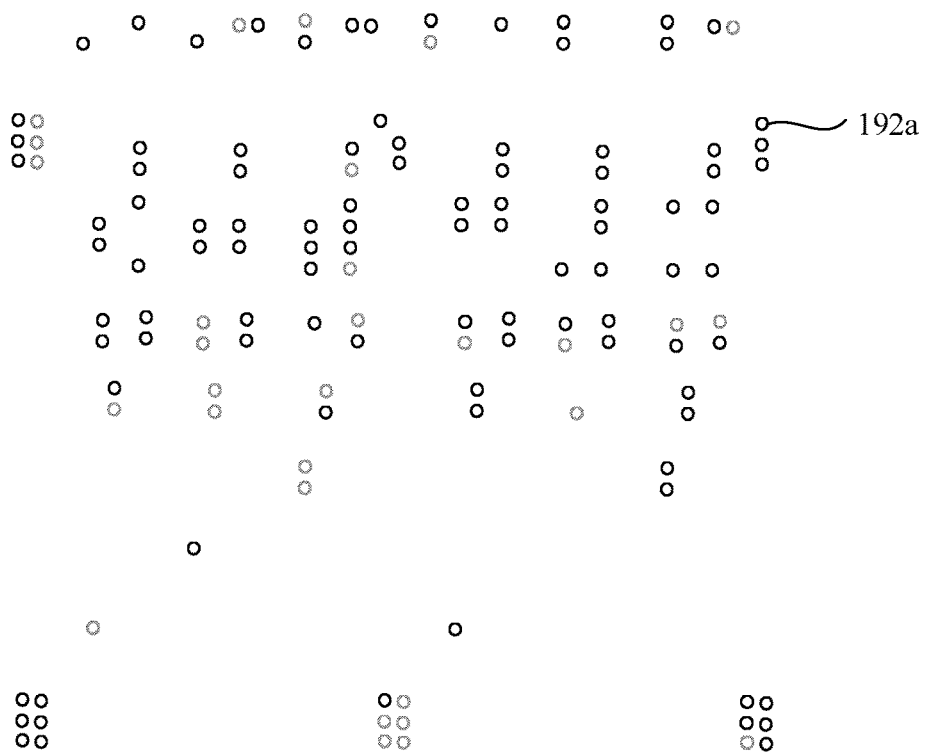
FIG. 19 is a schematic diagram of a via hole in an insulating layer of the test unit region shown in FIG. 15.
Figure 20:
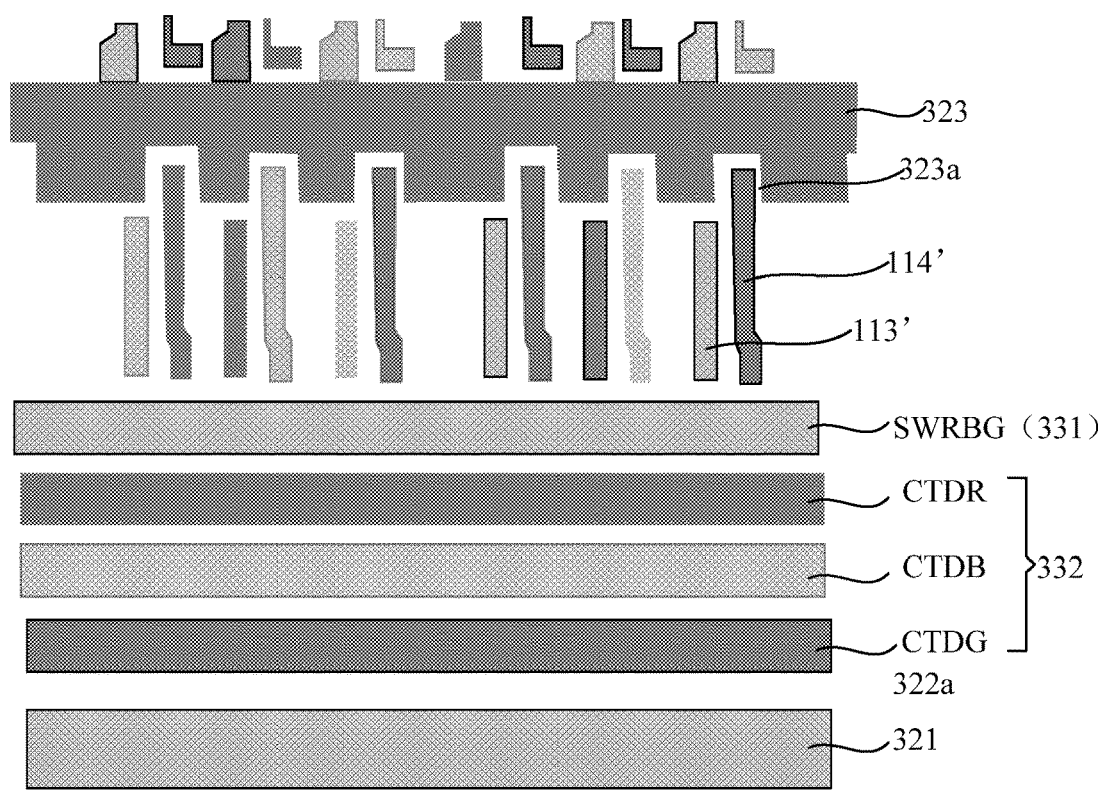
FIG. 20 is a schematic diagram of a structure of a layer where a source-drain metal layer of the a test unit region shown in FIG. 15 is located.

Referring to FIG. 15 to FIG. 20, active layers 111' (FIG. 16) of each test transistor are arranged at intervals along a second direction 992 (which may be disposed in the same layer as the first active layer 111) and covered by the gate insulating layer 190. A gate 112 of each test transistor may be disposed in the same layer as the first gate 112, and multiple connecting parts 322 and a data signal input line 203 (FIG. 17) are disposed in this layer. A structure 11*a* (or regarded as a part of the data line 11) for electrically connecting a drain of the test transistor with a corresponding data line 11 and a structure 332*a* (FIG. 18) for electrically connecting a source of the test transistor with a corresponding test data signal line 332 may be provided in the same layer as the second plate 122. A source 113' and a drain 114' of the test transistor (FIG. 20), the test control signal line 331, the test data signal line 332, the first power supply bus 321 and the second power supply bus 323 are disposed in the same layer as the first source 113 and the first drain 114. The electrical connection of corresponding structures can be realized through via holes 192a in a second insulating layer 192 (FIG. 19).

Referring to FIG. 21, a display substrate of this embodiment has three test data signal lines 332 and one test control signal line 331, and each test unit 330 includes three test transistors (a seventh test transistor 330g, an eighth test transistor 330h and a ninth test transistor 330i) for controlling three data lines 11 (which corresponds to the above three columns of sub-pixels 1, one column of sub-pixels 1 is green, one column of sub-pixels 1 is red, and one column of sub-pixels 1 is blue).

Figure 22:
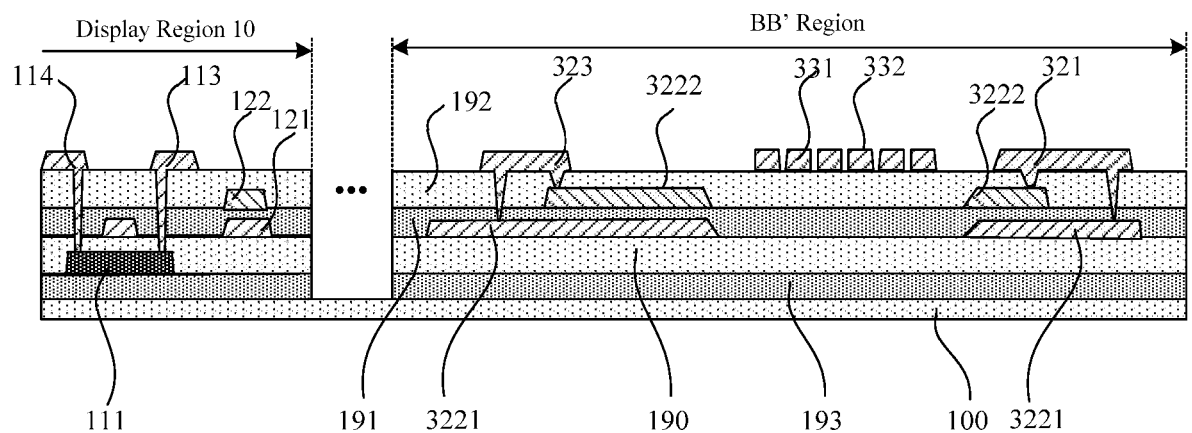
FIG. 22 is a schematic diagram of a structure of a display substrate after a pattern of a first source-drain metal layer is formed according to an exemplary embodiment of the present disclosure (in which a display region 10 corresponds to a display region in FIG. 1, and a BB' region corresponds to a BB' region in FIG. 2)

In an exemplary embodiment, as shown in FIG. 22, in a plane perpendicular to a display substrate, the display substrate may include a base substrate 100, a buffer layer 193 disposed on the base substrate 100, a first active layer disposed on the buffer layer 193, a gate insulating layer 190 disposed on the first active layer, a first gate metal layer disposed on the gate insulating layer 190, a first insulating layer 191 disposed on the first gate metal layer, a second gate metal layer disposed on the first insulating layer 191, a second insulating layer 192 disposed on the second gate metal layer, and a first source-drain metal layer disposed on the second insulating layer 192.

In the display substrate of this embodiment, the buffer layer 193 may not be provided between the base 100 and the first active layer.

In an exemplary embodiment, as shown in FIG. 22, a test signal line, a first power supply bus 321 and a second power supply bus 323 may all be located on the first source-drain metal layer, a connecting part 322 may be located on the second gate metal layer, and the connecting part 322 is connected with the first power supply bus 321 and the second power supply bus 323 respectively through via holes on the second insulating layer 192.

In an exemplary embodiment, as shown in FIG. 22, the connecting part 322 may include multiple first connecting parts 3221 and a plurality of second connecting parts 3222 which are parallel to each other. The first connecting parts 3221 are located on the first gate metal layer and the second connecting parts 3222 are located on the second gate metal layer. The first connecting parts 3221 are connected with the first power supply bus 321 and the second power supply bus 323 respectively through via holes penetrating through the third insulating layer 191 and the fourth insulating layer 192, and the second connecting parts 3222 are connected with the first power bus 321 and the second power bus 323 respectively through the via holes on the fourth insulating layer 192.

According to the display substrate of the embodiment of the present disclosure, the first connecting parts 3221 on the first gate metal layer and the second connecting parts 3222 on the second gate metal layer are used for parallel trace, so that resistance of the metal traces at a wire changing positions is further reduced, and the influence of resistance increase caused by cross-layer jumpers on voltage drops is further reduced, which is beneficial to display uniformity and reduces product power consumption.

In an exemplary embodiment, the test signal line, the first power supply bus 321 and the second power supply bus 323 are all located on the first source-drain metal layer. The connecting part 322 may be located on the first gate metal layer, and the connecting part 322 is connected with the first power supply bus 321 and the second power supply bus 323 respectively through via holes penetrating through the third insulating layer 191 and the fourth insulating layer 192.

In an exemplary embodiment, in a plane perpendicular to the display substrate, the display substrate may further include a fifth insulating layer and a first planarization layer disposed on the first source-drain metal layer, and a second source-drain metal layer disposed on the first planarization layer. The test signal line, the first power supply bus 321 and the second power supply bus 323 may also be disposed on the second source-drain metal layer, and the connecting part 322 may be disposed on the first source-drain metal layer, the second gate metal layer or the first gate metal layer, which is not limited by the present disclosure.

Figure 23:
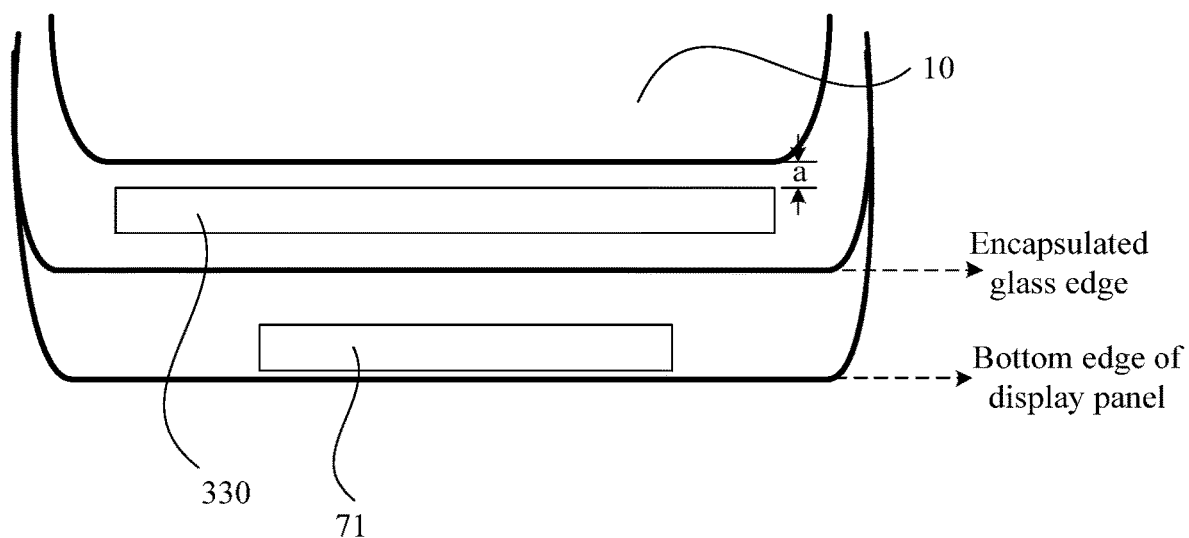
FIG. 23 is a schematic diagram of a structure at a lower bezel of a display substrate according to an exemplary embodiment of the present disclosure.

In an exemplary embodiment, in a plane perpendicular to a display substrate, the display substrate may further include an anode, a pixel definition (PDL) layer, a spacer post (PS), an organic light emitting layer, a cathode, and an encapsulation layer which are formed in the display region 10. As shown in FIG. 23, the encapsulation layer extends to cover a test unit 330. According to the display substrate of the embodiment of the present disclosure, the test unit 330 is placed inside the encapsulation layer to isolate water vapor, so as to prevent the test unit 330 from easily being corroded in a high temperature and high humidity environment, which results in poor display.

In an exemplary implementation, the encapsulation layer may include a first encapsulation layer, a second encapsulation layer and a third encapsulation layer that are stacked together. The first encapsulation layer and the third encapsulation layer are made of an inorganic material, and the second encapsulation layer is made of an organic material.

In an exemplary embodiment, as shown in FIG. 23, a distance a between the test unit 330 and an edge of the display region 10 close to the test unit 330 is smaller than or equal to a preset first distance. The preset first distance may be set according to the size of an actual space of traces. According to the display substrate of the embodiment of the present disclosure, the test unit 330 is placed close to the display region 10, so that the distance between the test unit 330 and the display region 10 is shortened, and driving capability of a test circuit is enhanced.

In an exemplary embodiment, the display substrate further includes an anode, a pixel definition (PDL) layer, a spacer post (PS), an organic light emitting layer, a cathode and an encapsulation layer which are formed in the display region 10. The encapsulation layer may include a first encapsulation layer, a second encapsulation layer and a third encapsulation layer which are stacked. The first encapsulation layer and the third encapsulation layer are made of inorganic material, and the second encapsulation layer is made of organic material.

The present disclosure further provides a display apparatus including the display substrate of the aforementioned embodiments. The display apparatus may be any product or component with a display function such as a mobile phone, a tablet computer, a TV set, a display, a laptop computer, a digital photo bezel, a navigator, etc.

The drawings in the present disclosure only refer to the structures involved in the present disclosure, and common designs may be referred to for other structures. The embodiments of the present disclosure, i.e., the features in the embodiments may be combined with each other to obtain a new embodiment if there is no conflict.

Those of ordinary skills in the art should understand that modifications or equivalent substitutions may be made to the technical solutions of the present disclosure without departing from the spirit and scope of the technical solutions of the present disclosure, all of which should be included within the scope of the claims of the present disclosure.

What is claimed is:

1. A display substrate, comprising:
   a base substrate comprising a display region and a peripheral region located at at least one side of the display region;
   a plurality of sub-pixels located in the display region;
   a plurality of data lines located in the display region and electrically connected with the plurality of sub-pixels, wherein the plurality of data lines are configured to provide data signals to the plurality of sub-pixels;
   a plurality of power supply lines located in the display region and electrically connected with the plurality of sub-pixels, wherein the plurality of power supply lines are configured to provide power supply signals to the plurality of sub-pixels;
   at least one test data signal line located in the peripheral region;
   at least one test control signal line located in the peripheral region;
   a plurality of test units located in the peripheral region and at a side of the plurality of data lines away from the display region, at least one of the plurality of test units is electrically connected with at least one of the plurality of data lines, the at least one test data signal line, and the at least one test control signal line, and is configured to transmit a signal provided by the at least one test data signal line to the at least one data line according to a signal provided by the at least one test control signal line;
   a first power supply bus located in the peripheral region and at a side of the plurality of test units away from the display region; and
   a plurality of connecting parts electrically connected with the first power supply bus and electrically connected with the plurality of power supply lines, wherein the plurality of connecting parts extend to the display region along a region between the plurality of test units.

2. The display substrate according to claim 1, further comprising a second power supply bus between the plurality of test units and the display region, wherein the plurality of connecting parts are electrically connected with the first power supply bus and the second power supply bus respectively.

3. The display substrate according to claim 2, wherein the first power supply bus, the second power supply bus and the plurality of connecting parts define a plurality of first openings arranged in an array, and an orthographic projection of the plurality of test units on the base substrate is in the plurality of first openings.

4. The display substrate according to claim 3, wherein the second power supply bus comprises a plurality of second openings, and the plurality of test units comprise a plurality of transistors, and drains of the plurality of transistors are located in the plurality of second openings.

5. The display substrate according to claim 2, wherein a test unit comprises a first test transistor, a second test transistor and a third test transistor;
   the at least one test data signal line comprises a first test data signal line, a second test data signal line and a third test data signal line;
   the at least one test control signal line comprises a first test control signal line, a second test control signal line and a third test control signal line;
   the plurality of data lines comprise first data lines and second data lines which are alternately arranged;
   a source of the first test transistor and a source of the second test transistor are connected with the first test data signal line and the second test data signal line respectively, a drain of the first test transistor and a drain of the second test transistor are connected with a first data line, and a gate of the first test transistor and a gate of the second test transistors are connected with the third test control signal line and the second test control signal line respectively; and
   a source of the third test transistor is connected with the third test data signal line, a drain of the third test transistor is connected with a second data line, and a gate of the third test transistor is connected with the first test control signal line.

6. The display substrate according to claim 5, wherein the test unit further comprises a fourth test transistor and a fifth test transistor, a drain of the fourth test transistor and a drain of the fifth test transistor are connected with another first data line, a gate of the fourth test transistor and a gate of the fifth test transistor are connected with the second test control signal line and the third test control signal line respectively, and a source of the fourth test transistor and a source of the fifth test transistor are connected with the first test data signal line and the second test data signal line.

7. The display substrate according to claim 6, wherein the first test transistor, the second test transistor and the third test transistor are located in one of the plurality of first openings, and the fourth test transistor and the fifth test transistor are located in a first opening adjacent to the one first opening.

8. The display substrate according to claim 6, wherein the first test transistor, the second test transistor, the fourth test transistor and the fifth test transistor are located in one of the plurality of first openings, and the third test transistor is located in a first opening adjacent to the one first opening.

9. The display substrate according to claim 5, wherein the test unit further comprises a fourth test transistor, a fifth test transistor and a sixth test transistor, a drain of the fourth test transistor and a drain of the fifth test transistor are connected with another first data line, a gate of the fourth test transistor and a gate of the fifth test transistor are connected with the second test control signal line and the third test control signal line respectively, and a source of the fourth test transistor and a source of the fifth test transistor are connected with the first test data signal line and the second test data signal line; and
   a source of the sixth test transistor is connected with the third test data signal line, a drain of the sixth test transistor is connected with another second data line, and a gate of the sixth test transistor is connected with the first test control signal line.

10. The display substrate according to claim 9, wherein the first test transistor, the second test transistor, and the third test transistor are located in one of the plurality of first openings, and the fourth test transistor, the fifth test transistor, and the sixth test transistor are located in a first opening adjacent to the one first opening.

11. The display substrate according to claim 2, wherein the test unit comprises a seventh test transistor, an eighth test transistor and a ninth test transistor;
    the at least one test data signal line comprises a fourth test data signal line, a fifth test data signal line and a sixth test data signal line;
    the at least one test control signal line comprises a fourth test control signal line;
    the plurality of data lines comprise a third data line, a fourth data line and a fifth data line which are alternately arranged;

a drain of the seventh test transistor is connected with the third data line, a source of seventh test transistor is connected with the fourth test data signal line, and a gate of the seventh test transistor is connected with the fourth test control signal line;

a drain of the eighth test transistor is connected with the fourth data line, a source of the eighth test transistor is connected with the fifth test data signal line, and a gate of the eighth test transistor is connected with the fourth test control signal line; and a drain of the ninth test transistor is connected with the fifth data line, and a source of the ninth test transistor is connected with the sixth test data signal line, and a gate of the ninth test transistor is connected with the fourth test control signal line.

12. The display substrate according to claim 11, wherein the seventh test transistor, the eighth test transistor and the ninth test transistor are located in one of the plurality of first openings.

13. The display substrate according to claim 1, wherein the at least one test control signal line and the at least one test data signal line are arranged in parallel along an extending direction of the plurality of connecting parts and are located between the plurality of test units and the first power supply bus.

14. The display substrate according to claim 1, wherein at least one of the plurality of connecting parts further comprises a third opening, and an orthographic projection of the third opening on the base substrate overlaps with an orthographic projection of at least one of the at least one test data signal line and the at least one test control signal line on the base substrate.

15. The display substrate according to claim 1, wherein in a plane perpendicular to the display substrate, the display substrate comprises a buffer layer, a first active layer, a gate insulating layer, a first gate metal layer, a first insulating layer, a second gate metal layer, a second insulating layer and a first source-drain metal layer stacked on the base substrate;

the at least one test control signal line, the at least one test data signal line, the first power supply bus and the plurality of power supply lines are all located on the first source-drain metal layer; and the plurality of connecting parts are located on the second gate metal layer, and are connected with the first power supply bus and the plurality of power supply lines respectively through via holes on the second insulating layer; or, the plurality of connecting parts are located on the first gate metal layer, and the plurality of connecting parts are connected with the first power supply bus and the plurality of power supply lines respectively through via holes penetrating through the first insulating layer and the second insulating layer.

16. The display substrate according to claim 1, wherein in a plane perpendicular to the display substrate, the display substrate comprises a buffer layer, a first active layer, a gate insulating layer, a first gate metal layer, a first insulating layer, a second gate metal layer, a second insulating layer and a first source-drain metal layer stacked on the base substrate;

the at least one test control signal line, the at least one test data signal line, the first power supply bus and the plurality of power supply lines are all located on the first source-drain metal layer; and the plurality of connecting parts comprises first connecting parts and second connecting parts, wherein the second connecting parts are located on the second gate metal layer, and the second connecting parts are connected with the first power supply bus and the plurality of power supply lines respectively through via holes on the second insulating layer; the first connecting parts are located on the first gate metal layer, and the first connecting parts are connected with the first power supply bus and the plurality of power supply lines respectively through via holes penetrating through the first insulating layer and the second insulating layer.

17. The display substrate according to claim 1, further comprising a plurality of data signal input lines located in the peripheral region, wherein the plurality of data signal input lines are located at a side of the plurality of test units away from the display region, and at least one of the plurality of data signal input lines is electrically connected with the at least one test unit.

18. A display apparatus, comprising the display substrate according to claim 1.

* * * * *